United States Patent
Azuma et al.

(10) Patent No.: US 9,007,520 B2
(45) Date of Patent: Apr. 14, 2015

(54) CAMERA MODULE WITH EMI SHIELD

(75) Inventors: Eddie Azuma, San Jose, CA (US); Chih Yen Liu, San Jose, CA (US); Josh Tsai, San Jose, CA (US); Emerson Yu, San Jose, CA (US); David Hsieh, San Jose, CA (US)

(73) Assignee: Nanchang O-Film Optoelectronics Technology Ltd, Nanchang (CN)

( * ) Notice: Subject to any disclaimer, the term of this patent is extended or adjusted under 35 U.S.C. 154(b) by 53 days.

(21) Appl. No.: 13/571,395

(22) Filed: Aug. 10, 2012

(65) Prior Publication Data

US 2014/0043519 A1 Feb. 13, 2014

(51) Int. Cl.
| | |
|---|---|
| H04N 5/225 | (2006.01) |
| H04N 5/232 | (2006.01) |
| H04N 5/228 | (2006.01) |
| G03B 3/10 | (2006.01) |
| G02B 7/09 | (2006.01) |
| H01L 27/146 | (2006.01) |

(52) U.S. Cl.
CPC .. *G03B 3/10* (2013.01); *G02B 7/09* (2013.01); *H04N 5/2252* (2013.01); *H04N 5/2254* (2013.01); *H01L 27/14618* (2013.01); *H04N 5/2257* (2013.01)

(58) Field of Classification Search
USPC ............ 348/208.4, 208.7, 373–376, 360, 361
See application file for complete search history.

(56) References Cited

U.S. PATENT DOCUMENTS

| | | | |
|---|---|---|---|
| 4,383,565 A * | 5/1983 | Denmat | ...................... 206/316.1 |
| 5,882,221 A | 3/1999 | Nguyen et al. | |
| 6,137,691 A | 10/2000 | Jang | |
| 6,583,444 B2 | 6/2003 | Fjelstad | |
| 6,873,358 B1 | 3/2005 | Shimizu | |
| 6,888,168 B2 | 5/2005 | Fjelstad | |
| 7,095,054 B2 | 8/2006 | Fjelstad | |
| 7,224,056 B2 | 5/2007 | Burtzlaff et al. | |
| 7,289,278 B1 | 10/2007 | Jo et al. | |
| 7,315,631 B1 | 1/2008 | Corcoran et al. | |
| 7,315,658 B2 | 1/2008 | Steinberg et al. | |
| 7,317,815 B2 | 1/2008 | Steinberg et al. | |
| 7,352,394 B1 | 4/2008 | DeLuca et al. | |
| 7,368,695 B2 | 5/2008 | Kang et al. | |

(Continued)

FOREIGN PATENT DOCUMENTS

| | | |
|---|---|---|
| CN | 1220573 A | 6/1999 |
| CN | 1479506 A | 3/2004 |

(Continued)

OTHER PUBLICATIONS

U.S. Appl. No. 13/571,393, Notice of Allowance dated Nov. 27, 2013.

(Continued)

*Primary Examiner* — Twyler Haskins
*Assistant Examiner* — Padma Haliyur
(74) *Attorney, Agent, or Firm* — Larry E. Henneman, Jr.; Gregory P. Gibson; Henneman & Associates, PLC

(57) ABSTRACT

A compact camera module has an EMI housing configured to shield camera module components from electromagnetic interference and having defined therein a focus-adjustment aperture to permit an optical train to extend to at one end of an auto-focus range, and a light leak baffle partially overlaps the focus-adjustment aperture along the optical path outside the auto-focus range.

38 Claims, 16 Drawing Sheets

(56) References Cited

U.S. PATENT DOCUMENTS

| | | |
|---|---|---|
| 7,403,643 B2 | 7/2008 | Ianculescu et al. |
| 7,440,593 B1 | 10/2008 | Steinberg et al. |
| 7,443,597 B2 | 10/2008 | Humpston |
| 7,449,779 B2 | 11/2008 | Honer et al. |
| 7,460,695 B2 | 12/2008 | Steinberg et al. |
| 7,506,057 B2 | 3/2009 | Bigioi et al. |
| 7,515,740 B2 | 4/2009 | Corcoran et al. |
| 7,536,036 B2 | 5/2009 | Steinberg et al. |
| 7,551,800 B2 | 6/2009 | Corcoran et al. |
| 7,564,111 B2 | 7/2009 | Sawahata et al. |
| 7,564,994 B1 | 7/2009 | Steinberg et al. |
| 7,565,030 B2 | 7/2009 | Steinberg et al. |
| 7,566,853 B2 | 7/2009 | Tuckerman et al. |
| 7,569,424 B2 | 8/2009 | Nystrom et al. |
| 7,590,305 B2 | 9/2009 | Steinberg et al. |
| 7,593,636 B2 | 9/2009 | Nystrom et al. |
| 7,599,577 B2 | 10/2009 | Ciuc et al. |
| 7,606,417 B2 | 10/2009 | Steinberg et al. |
| 7,620,218 B2 | 11/2009 | Steinberg et al. |
| 7,630,006 B2 | 12/2009 | DeLuca et al. |
| 7,636,486 B2 | 12/2009 | Steinberg et al. |
| 7,639,888 B2 | 12/2009 | Steinberg et al. |
| 7,680,342 B2 | 3/2010 | Steinberg et al. |
| 7,683,468 B2 | 3/2010 | Haba et al. |
| 7,685,341 B2 | 3/2010 | Steinberg et al. |
| 7,692,696 B2 | 4/2010 | Steinberg et al. |
| 7,694,048 B2 | 4/2010 | Steinberg et al. |
| 7,715,597 B2 | 5/2010 | Costache et al. |
| 7,738,015 B2 | 6/2010 | Steinberg et al. |
| 7,747,155 B1 | 6/2010 | Gutierrez |
| 7,747,596 B2 | 6/2010 | Bigioi et al. |
| 7,768,574 B2 | 8/2010 | Humpston |
| 7,773,118 B2 | 8/2010 | Florea et al. |
| 7,787,198 B1 | 8/2010 | Xu et al. |
| 7,792,335 B2 | 9/2010 | Steinberg et al. |
| 7,807,508 B2 | 10/2010 | Oganesian et al. |
| 7,844,076 B2 | 11/2010 | Corcoran et al. |
| 7,855,737 B2 | 12/2010 | Petrescu et al. |
| 7,858,445 B2 | 12/2010 | Honer et al. |
| 7,916,897 B2 | 3/2011 | Corcoran et al. |
| 7,916,971 B2 | 3/2011 | Bigioi et al. |
| 7,920,163 B1 | 4/2011 | Kossin |
| 7,927,070 B2 | 4/2011 | Godsk et al. |
| 7,935,568 B2 | 5/2011 | Oganesian et al. |
| 7,936,062 B2 | 5/2011 | Humpston et al. |
| 7,965,875 B2 | 6/2011 | Ionita et al. |
| 7,970,182 B2 | 6/2011 | Prilutsky et al. |
| 7,995,804 B2 | 8/2011 | Steinberg et al. |
| 7,995,855 B2 | 8/2011 | Albu et al. |
| 8,004,780 B2 | 8/2011 | Gutierrez et al. |
| 8,005,268 B2 | 8/2011 | Steinberg et al. |
| 8,014,662 B1 | 9/2011 | Gutierrez et al. |
| RE42,898 E | 11/2011 | Shimizu et al. |
| 8,055,029 B2 | 11/2011 | Petrescu et al. |
| 8,055,067 B2 | 11/2011 | Petrescu et al. |
| 8,081,254 B2 | 12/2011 | Nanu et al. |
| 8,090,252 B1 | 1/2012 | Tang et al. |
| 8,119,516 B2 | 2/2012 | Endo |
| 8,340,462 B1 | 12/2012 | Gigushinski et al. |
| 8,577,186 B1 | 11/2013 | Gigushinski et al. |
| 8,675,115 B1 | 3/2014 | Gigushinski et al. |
| 2004/0021792 A1 | 2/2004 | Yasui |
| 2004/0132491 A1 | 7/2004 | Kim et al. |
| 2005/0040510 A1 | 2/2005 | Hashimoto |
| 2005/0067688 A1 | 3/2005 | Humpston |
| 2005/0082653 A1 | 4/2005 | McWilliams et al. |
| 2005/0082654 A1 | 4/2005 | Humpston et al. |
| 2005/0085016 A1 | 4/2005 | McWilliams et al. |
| 2005/0087861 A1 | 4/2005 | Burtzlaff et al. |
| 2005/0095835 A1 | 5/2005 | Humpston et al. |
| 2005/0212947 A1 | 9/2005 | Sato et al. |
| 2005/0285973 A1 | 12/2005 | Singh et al. |
| 2006/0087017 A1 | 4/2006 | Chao et al. |
| 2006/0098969 A1 | 5/2006 | Asai et al. |
| 2006/0152826 A1 | 7/2006 | Tsutsui |
| 2006/0223216 A1 | 10/2006 | Chang et al. |
| 2006/0239671 A1 | 10/2006 | Shiraishi et al. |
| 2007/0096295 A1 | 5/2007 | Burtzlaff et al. |
| 2007/0096311 A1 | 5/2007 | Humpston et al. |
| 2007/0096312 A1 | 5/2007 | Humpston et al. |
| 2007/0138644 A1 | 6/2007 | McWilliams et al. |
| 2007/0139528 A1 | 6/2007 | Chang |
| 2007/0145564 A1 | 6/2007 | Honer |
| 2007/0190691 A1 | 8/2007 | Humpston et al. |
| 2007/0190747 A1 | 8/2007 | Humpston et al. |
| 2007/0269108 A1 | 11/2007 | Steinberg et al. |
| 2007/0296833 A1 | 12/2007 | Corcoran et al. |
| 2008/0029879 A1 | 2/2008 | Tuckerman et al. |
| 2008/0074528 A1 | 3/2008 | Westerweck et al. |
| 2008/0099900 A1 | 5/2008 | Oganesian et al. |
| 2008/0099907 A1 | 5/2008 | Oganesian et al. |
| 2008/0112599 A1 | 5/2008 | Nanu et al. |
| 2008/0122967 A1 | 5/2008 | Huang |
| 2008/0157323 A1 | 7/2008 | Haba |
| 2008/0170141 A1 | 7/2008 | Tam et al. |
| 2008/0219517 A1 | 9/2008 | Blonk et al. |
| 2008/0219581 A1 | 9/2008 | Albu et al. |
| 2008/0220750 A1 | 9/2008 | Steinberg et al. |
| 2008/0266419 A1 | 10/2008 | Drimbarean et al. |
| 2008/0267617 A1 | 10/2008 | Huang et al. |
| 2008/0296717 A1 | 12/2008 | Beroz et al. |
| 2008/0309769 A1 | 12/2008 | Albu et al. |
| 2008/0309770 A1 | 12/2008 | Florea et al. |
| 2009/0023249 A1 | 1/2009 | Honer et al. |
| 2009/0039734 A1 | 2/2009 | Takahashi et al. |
| 2009/0080713 A1 | 3/2009 | Bigioi et al. |
| 2009/0080796 A1 | 3/2009 | Capata et al. |
| 2009/0080797 A1 | 3/2009 | Nanu et al. |
| 2009/0115885 A1 | 5/2009 | Shabtay et al. |
| 2009/0115915 A1 | 5/2009 | Steinberg et al. |
| 2009/0122162 A1 | 5/2009 | Shabtay et al. |
| 2009/0123063 A1 | 5/2009 | Ciuc |
| 2009/0128681 A1 | 5/2009 | Kim |
| 2009/0141161 A1 | 6/2009 | Kawamoto |
| 2009/0167893 A1 | 7/2009 | Susanu et al. |
| 2009/0179998 A1 | 7/2009 | Steinberg et al. |
| 2009/0179999 A1 | 7/2009 | Albu et al. |
| 2009/0189997 A1 | 7/2009 | Stec et al. |
| 2009/0189998 A1 | 7/2009 | Nanu et al. |
| 2009/0190803 A1 | 7/2009 | Neghina et al. |
| 2009/0196466 A1 | 8/2009 | Capata et al. |
| 2009/0201399 A1 | 8/2009 | Senga |
| 2009/0212381 A1 | 8/2009 | Crisp et al. |
| 2009/0213232 A1 | 8/2009 | Asakura et al. |
| 2009/0225171 A1 | 9/2009 | Shabtay et al. |
| 2009/0238419 A1 | 9/2009 | Steinberg et al. |
| 2009/0278978 A1 | 11/2009 | Suzuki |
| 2009/0303343 A1 | 12/2009 | Drimbarean et al. |
| 2010/0026831 A1 | 2/2010 | Ciuc et al. |
| 2010/0053407 A1 | 3/2010 | Crisp et al. |
| 2010/0066822 A1 | 3/2010 | Steinberg et al. |
| 2010/0091120 A1 | 4/2010 | Nagata |
| 2010/0141787 A1 | 6/2010 | Bigioi et al. |
| 2010/0232042 A1 | 9/2010 | Terajima |
| 2010/0253834 A1 | 10/2010 | Ogane |
| 2010/0272363 A1 | 10/2010 | Steinberg et al. |
| 2010/0284081 A1 | 11/2010 | Gutierrez et al. |
| 2010/0321537 A1 | 12/2010 | Zamfir et al. |
| 2010/0329582 A1 | 12/2010 | Albu et al. |
| 2010/0329654 A1 | 12/2010 | Chiang |
| 2011/0002506 A1 | 1/2011 | Ciuc et al. |
| 2011/0007174 A1 | 1/2011 | Bacivarov et al. |
| 2011/0081052 A1 | 4/2011 | Bigioi et al. |
| 2011/0102553 A1 | 5/2011 | Corcoran et al. |
| 2011/0102667 A1 | 5/2011 | Chua et al. |
| 2011/0141226 A1 | 6/2011 | Stec et al. |
| 2011/0141227 A1 | 6/2011 | Bigioi et al. |
| 2011/0151651 A1 | 6/2011 | Xiong et al. |
| 2011/0199530 A1 | 8/2011 | Kosaka et al. |
| 2011/0202330 A1 | 8/2011 | Dai et al. |
| 2011/0205381 A1 | 8/2011 | Vranceanu et al. |
| 2011/0211821 A1 | 9/2011 | Park et al. |
| 2011/0216156 A1 | 9/2011 | Bigioi et al. |
| 2011/0216158 A1 | 9/2011 | Bigioi et al. |

(56) References Cited

U.S. PATENT DOCUMENTS

| | | |
|---|---|---|
| 2011/0221936 A1 | 9/2011 | Steinberg et al. |
| 2011/0230013 A1 | 9/2011 | Haba |
| 2011/0235196 A1 | 9/2011 | Ke |
| 2011/0255182 A1 | 10/2011 | Calvet et al. |
| 2011/0273593 A1 | 11/2011 | Cohen et al. |
| 2011/0274423 A1 | 11/2011 | Gutierrez |
| 2011/0292273 A1 | 12/2011 | Kim et al. |
| 2011/0304914 A1 | 12/2011 | Gutierrez et al. |
| 2011/0317013 A1 | 12/2011 | Gutierrez et al. |
| 2012/0007942 A1 | 1/2012 | Michrowski et al. |
| 2012/0008002 A1 | 1/2012 | Bigioi et al. |
| 2012/0019613 A1 | 1/2012 | Murray et al. |
| 2012/0019614 A1 | 1/2012 | Murray et al. |
| 2012/0044368 A1 | 2/2012 | Lin et al. |
| 2012/0062761 A1 | 3/2012 | Ianculescu et al. |
| 2012/0063761 A1 | 3/2012 | Tang et al. |
| 2012/0075492 A1 | 3/2012 | Nanu et al. |
| 2012/0099005 A1 | 4/2012 | Kali et al. |
| 2012/0106790 A1 | 5/2012 | Sultana et al. |
| 2012/0106936 A1 | 5/2012 | Lim et al. |
| 2012/0120261 A1 | 5/2012 | Mehra et al. |
| 2012/0120283 A1 | 5/2012 | Capata et al. |
| 2012/0133746 A1 | 5/2012 | Bigioi et al. |
| 2012/0162502 A1 | 6/2012 | Lee et al. |
| 2012/0200725 A1 | 8/2012 | Albu et al. |
| 2012/0206617 A1 | 8/2012 | Albu et al. |
| 2012/0206627 A1 | 8/2012 | Reshidko et al. |
| 2012/0218398 A1 | 8/2012 | Mehra |
| 2012/0224075 A1 | 9/2012 | Lim et al. |
| 2012/0236175 A1 | 9/2012 | Kinrot |
| 2012/0249726 A1 | 10/2012 | Corcoran et al. |
| 2012/0249727 A1 | 10/2012 | Corcoran et al. |
| 2012/0249841 A1 | 10/2012 | Corcoran et al. |
| 2012/0250937 A1 | 10/2012 | Corcoran et al. |
| 2012/0300088 A1 | 11/2012 | Terajima |
| 2012/0320463 A1 | 12/2012 | Shabtay et al. |
| 2013/0050395 A1 | 2/2013 | Paoletti et al. |
| 2013/0070125 A1 | 3/2013 | Albu |
| 2013/0070126 A1 | 3/2013 | Albu |
| 2013/0076924 A1 | 3/2013 | Wade et al. |
| 2013/0265470 A1 | 10/2013 | Liu et al. |
| 2013/0270419 A1 | 10/2013 | Singh et al. |
| 2014/0043496 A1 | 2/2014 | Azuma |
| 2014/0043524 A1 | 2/2014 | Azuma et al. |
| 2014/0043525 A1 | 2/2014 | Azuma et al. |

FOREIGN PATENT DOCUMENTS

| | | |
|---|---|---|
| CN | 1518384 A | 8/2004 |
| CN | 101432759 A | 5/2009 |
| JP | 2004-274164 A | 9/2004 |
| JP | 2007-041419 A | 2/2007 |
| JP | 2007-174380 A | 7/2007 |
| JP | 2007-274624 A | 10/2007 |
| JP | 2008-294960 A | 12/2008 |
| TW | 1242820 B | 11/2005 |
| WO | WO 2006/011200 A1 | 2/2006 |
| WO | WO 2007/110097 A1 | 10/2007 |
| WO | WO 2011/056228 A1 | 5/2011 |
| WO | WO 2012/109160 A1 | 8/2012 |
| WO | WO 2014 026202 A1 | 2/2014 |

OTHER PUBLICATIONS

PCT Application No. PCT/US2013/054590, International Search Report & Written Opinion dated Jan. 29, 2014.

U.S. Appl. No. 12/590,325, Office Action dated Dec. 7, 2011.

U.S. Appl. No. 12/590,325, Notice of Allowance dated May 23, 2012.

PCT App. Serial No. PCT/US2010/002913, International Search Report & Written Opinion dated Jan. 5, 2011.

PCT App. Serial No. PCT/US2010/002913, International Preliminary Report on Patentability dated Jan. 13, 2012.

CA Patent Application Serial No. 2,780,157, Office Action dated Dec. 18, 2013.

CN Patent Application Serial No. 201080060668.5, Office Action dated Jun. 27, 2014 (English translation).

EP Application Serial No. 10828667.5, European Search Report dated Jul. 31, 2014.

JP Application Serial No. 2012-537862, Office Action dated Aug. 6, 2013 (English translation).

U.S. Appl. No. 13/571,397, Office Action dated Apr. 22, 2014.

U.S. Appl. No. 13/571,405, Office Action dated Jun. 23, 2014.

U.S. Appl. No. 14/270,958, Office Action dated Oct. 14, 2014.

The specification, claims, and drawings of unpublished U.S. Appl. No. 61/609,293, filed Mar. 10, 2012 by Lipson et al., which is entitled "Miniature Camera Module with Autofocus Zoom".

The specification, claims, and drawings of unpublished U.S. Appl. No. 61/622,480, filed Apr. 10, 2012 by Gutierrez, which is entitled "Camera Module with Accelerometer".

The specification, claims, and drawings of unpublished U.S. Appl. No. 61/643,331, filed May 6, 2012 by Lipson et al., which is entitled "Auto Focus Zoom Camera Module".

The specification, claims, and drawings of unpublished U.S. Appl. No. 61/675,812, filed Jul. 25, 2012 by Azuma, which is entitled "Camera Orientation Sensing Using MEMS AF Actuator".

U.S. Appl. No. 13/571,397, Office Action dated Jan. 14, 2015.

* cited by examiner

Module Overview

Design Concept for EMI Housing

Light Leak Baffle EMI design

- Light leak baffle material: Carbon Feather (conductive)
- Adhesive: conductive glue, 0.05t EMI Coating/ Conductive Trace EMI coating on outside surfaces
(1002)

Conductive Trace inside
(1003)

Assembly View

Exploded View

Soft materials
(x4 or x5)

Camera module

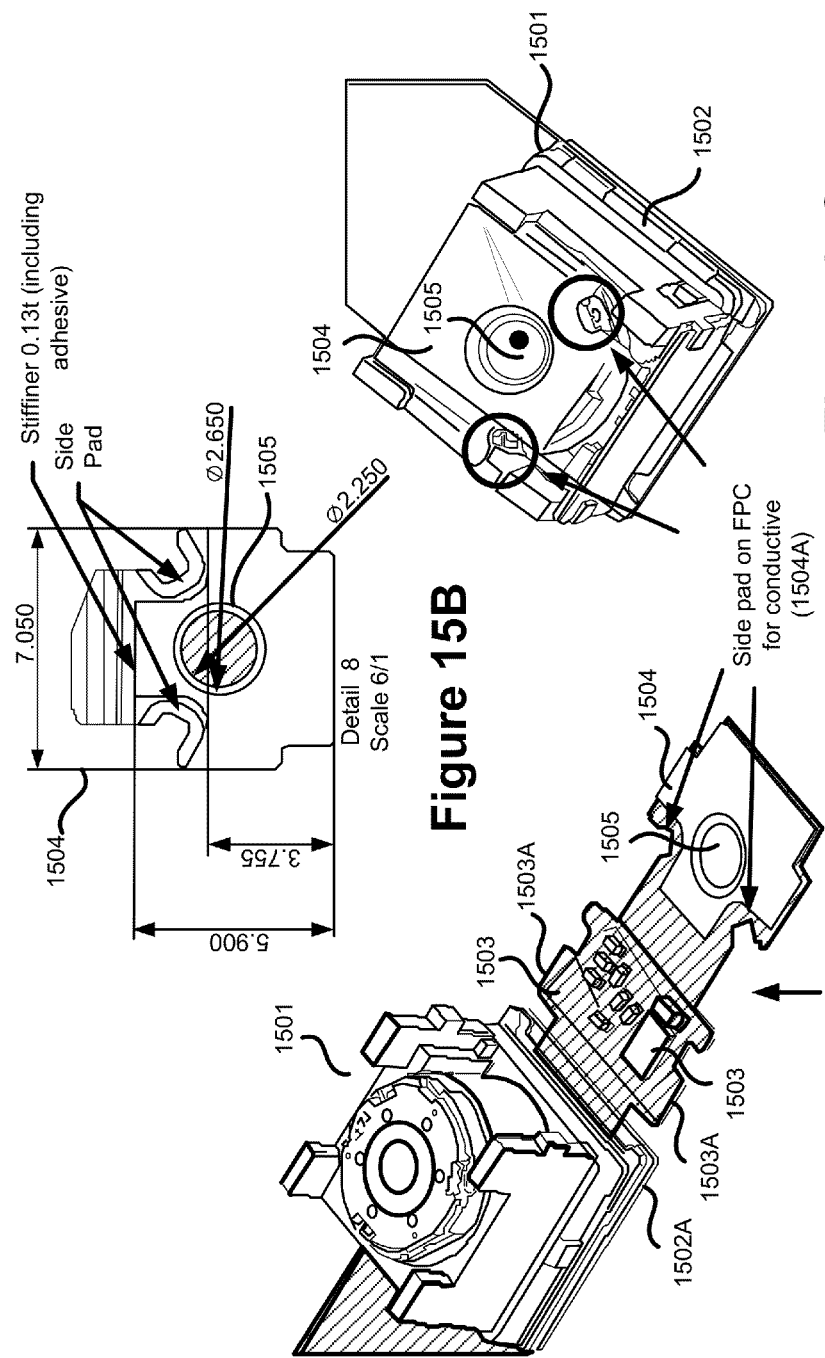

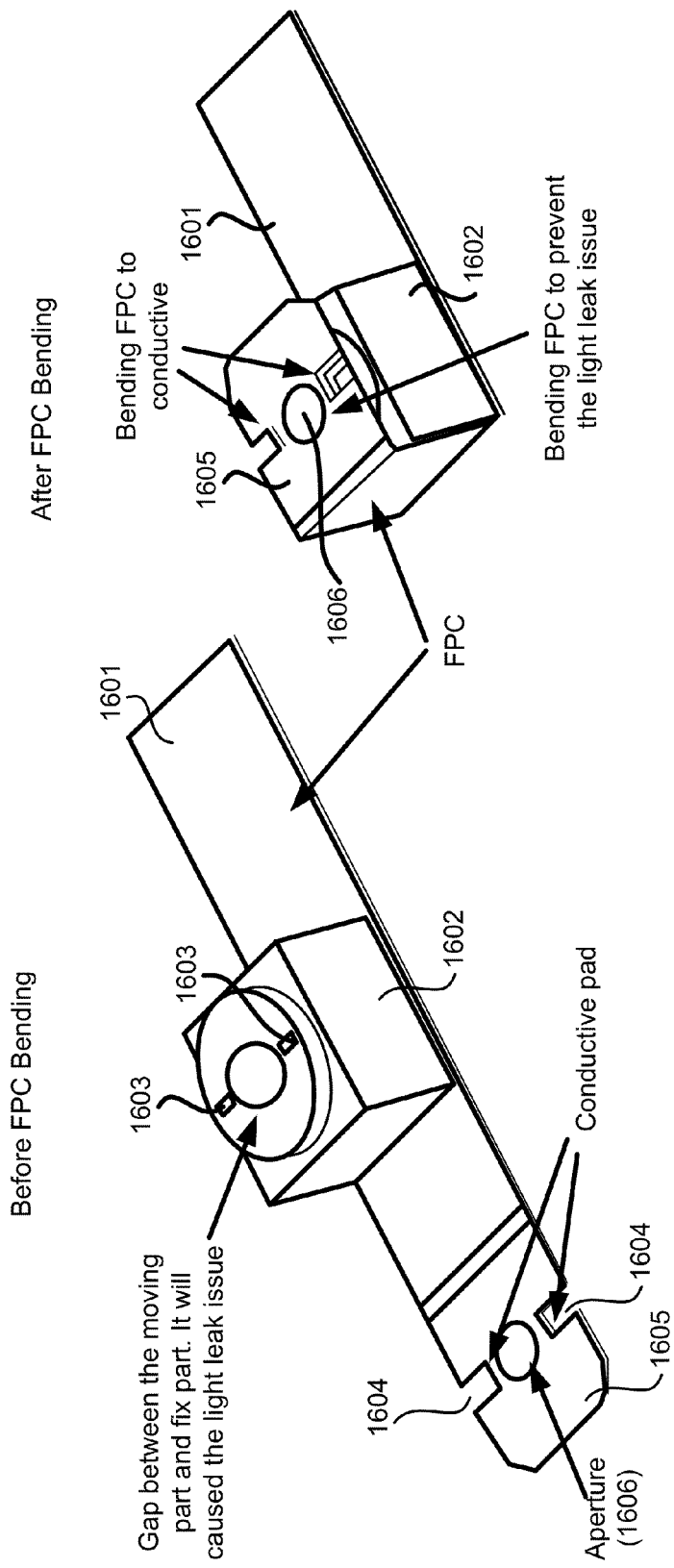

CAMERA MODULE WITH EMI SHIELD

RELATED APPLICATIONS

This application is one of a series of contemporaneously-filed patent applications, the others of the series including U.S. patent application Ser. No. 13/571,393, entitled CAMERA MODULE WITH COMPACT SPONGE ABSORBING DESIGN; U.S. patent application Ser. No. 13/571,397, entitled AUTO-FOCUS CAMERA MODULE WITH INTERIOR CONDUCTIVE TRACE; and U.S. patent application Ser. No. 13/571,405, entitled AUTO-FOCUS CAMERA MODULE WITH FLEXIBLE PRINTED CIRCUIT EXTENSION; each of which is hereby incorporated by reference.

BACKGROUND

1. Field of the Invention

The invention relates to compact camera modules, and particularly having auto-focus, and optionally zoom, functionality contained in an efficient, versatile and durable packaging environment.

2. Description of Related Art

A camera module may be figuratively or actually separated into two main components, namely a sensor component and an optical train component. If the positions of all lenses of the optical train and/or one or more constituent lenses are fixed relative to the position of the image sensor the resulting electronic camera is said to be fixed focus. Rigidly fixing the optical system in place means only objects that are a certain distance from the camera will be in focus on the image sensor. Fixed focus cameras have advantages in terms of smallness of physical dimensions and cost, but the performance is limited. In particular, the focus distance is often set at 1.2 m so that objects from 60 cm to infinity appear tolerably sharp. However, the image sharpness is not especially good and objects that are closer to the camera than 60 cm will always be blurred. While it is possible to set the focus at a closer distance to correct for this problem, this means that the sharpness of distant objects declines in compensation.

It is therefore desired to have a compact camera module that has auto-focus, and optionally zoom, functionality that is contained in an efficient, versatile and durable packaging environment.

BRIEF DESCRIPTION OF THE DRAWINGS

FIGS. 15A-15C schematically illustrate a camera module, before (15A) and after (15C) FPC bending in accordance with certain embodiments, wherein the camera module is physically and electronically coupled to a bendable, flexible printed circuit (FPC) at a sensor end, and wherein the FPC includes one or more conductive side pads for electrically contacting actuator pads at the image end of the lens barrel of the camera module.

FIGS. 16A-16B schematically illustrate a camera module in accordance certain embodiments, before and after FPC bending as in FIGS. 15A and 15C, respectively, wherein the FPC is configured both to electrically connect to actuator contacts and to serve as or couple to a light leak baffle, e.g., as alternative to the embodiment described with reference to FIGS. 6A and 7-9.

DETAILED DESCRIPTIONS OF THE EMBODIMENTS

Figure 1:
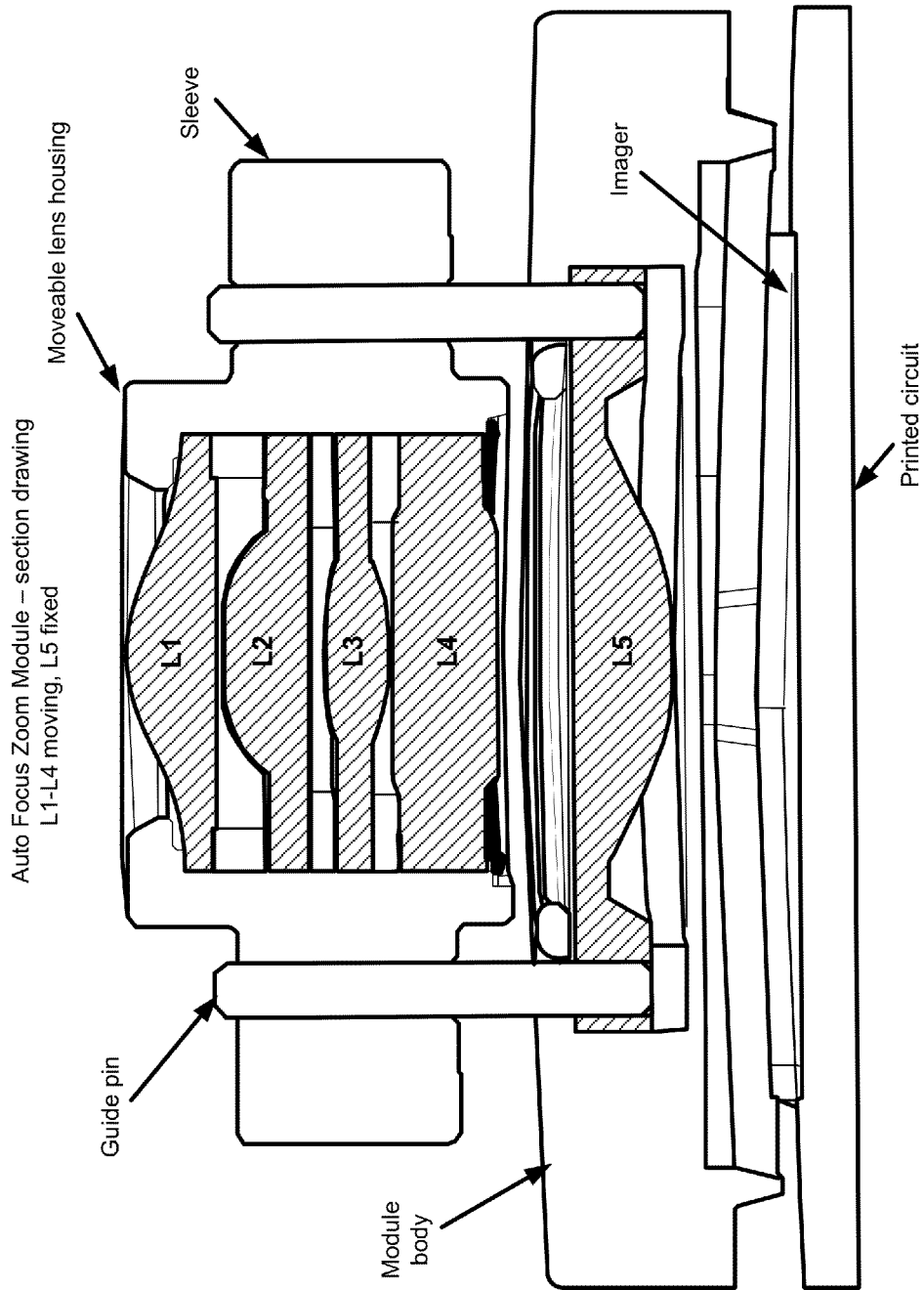
FIG. 1 schematically illustrates a cross sectional view of an example of an auto focus camera module including a subset of movable lenses and a MEMS actuator in accordance with certain embodiments.

A compact camera module is provided in accordance with certain embodiments that includes an image sensor configured to couple to a flexible printed circuit to power the camera module and transmit images captured at the image sensor, and an optical train aligned with the image sensor that includes multiple lenses. At least one movable lens is coupled to an actuator, e.g., a MEMS actuator, to form an optical system that is configured to automatically adjust a position of the at least one movable lens along the optical path to focus an object disposed within an auto-focus range of the camera module onto the image sensor. The compact camera module includes an EMI housing configured to contain the optical train and to shield camera module components from electromagnetic interference (EMI). The EMI housing has defined therein a focus-adjustment aperture that is large enough to permit an object end of the optical train to at least partially protrude therethrough at one end of the auto-focus range. A light leak baffle has a baffle aperture defined therein that partially overlaps the focus-adjustment aperture along the optical path. The light leak baffle includes EMI shield material that partially overlaps the focus adjustment aperture in the direction of the optical path, but lies outside the auto-focus range along the direction of the optical path.

The one or more lenses of the optical train may be disposed within a lens barrel. The lens barrel may the at least one movable lens. The lens barrel may be movable with lenses fixed therein and/or one or more lenses may be movable within the lens barrel.

The EMI housing may include an EMI coating. Alternatively, the EMI housing may be formed of conductive, semiconductive and/or otherwise EMI shielding material. The light leak baffle may also include a conductive, semiconductive or other EMI shielding material that provides additional EMI shielding for camera module components. The conductive material of the light leak baffle may include carbon, e.g., carbon feather material. A conductive glue may be used for coupling the light leak baffle to the housing, e.g., at the outside the housing or at an interior recess.

Another auto focus digital camera module that includes a housing, an image sensor within the housing, an optical train within the housing aligned with the image sensor defining an optical path and including multiple lenses including at least one movable lens coupled to a lens actuator configured to move the at least one movable lens along the optical path to focus a subject onto the image sensor that is disposed within an auto-focus range of the camera module. A flexible printed circuit (FPC) includes a sensor segment coupled to the image sensor to power the camera module and to carry electronic signals that include digital images captured by the image sensor. The FPC also includes an extension segment spaced from the sensor segment that includes electrical contact pads configured to electrically couple to lens actuator contact pads to carry lens actuator control signals when the FPC is folded around the camera module from the sensor end to the object end.

The flexible printed circuit may include a middle segment between the sensor segment and the extension segment that encloses at least one side of the camera module. The extension segment may be coupled at an object end of the camera module opposite the sensor segment that is coupled at the sensor end of the camera module. The housing may include an electromagnetic interference (EMI) coating on an outside surface.

The housing may have defined therein a focus-adjustment aperture that is large enough to permit an object end of the optical train to at least partially protrude therethrough at one end of the auto-focus range. The light leak baffle may partially overlaps the focus adjustment aperture outside the auto-focus range of the object end of the optical train. A baffle cavity may be defined in the light leak baffle that is smaller than the focus adjustment aperture and permits light to enter the camera module to acquire images.

Another compact camera module is provided for an auto focus digital camera including a housing configured to contain imaging optics and digital electronics for capturing and transmitting images and to shield electronic components from electromagnetic interference (EMI). An optical train is coupled and aligned with an image sensor and is configured to define an optical path to focus a subject onto an image sensor that is disposed at a focal plane of the optical train. A flexible printed circuit is coupled to the image sensor to carry electronic signals that include digital images captured by the image sensor. A light leak baffle is coupled to the flexible printed circuit and defines a baffle cavity a predetermined distance from the image sensor such that upon folding the FPC onto the housing the light leak baffle is disposed at the subject side of the optical train and the baffle cavity overlaps the optical path.

The FPC may be configured such that, upon folding the FPC onto the housing, one or more electrical contact pads disposed on the subject side of the optical train are coupled electrically with the FPC from which lens actuator control signals are transmittable directly from the FPC to the lens actuator. The light leak baffle may be configured to block some ambient light from entering the camera through a focus adjustment aperture defined in the housing to permit an object end of the optical train to at least partially protrude therethrough at one end of an auto-focus range. The light leak baffle may include a conductive or semiconductive material that provides EMI shielding, such as carbon. A baffle cavity may be defined in the light leak baffle that is smaller than the focus adjustment aperture and permits light to enter the camera module to acquire images. The flexible printed circuit may include a middle segment between the sensor segment and the extension segment that encloses at least one side of the camera module.

A compact camera module for an auto focus digital camera is also provided that includes a housing configured to contain imaging optics and digital electronics for capturing and transmitting images and to shield electronic components from electromagnetic interference (EMI). An optical train is coupled and aligned with an image sensor including multiple lenses configured to define an optical path within the housing to focus a subject onto the image sensor that is disposed at the focal plane of the optical train. A MEMS actuator is coupled to at least one movable lens of the optical train that is movable through an auto-focus range of a camera module formed by aligning an image sensor component to the compact optical module. A flexible printed circuit is coupled to the image sensor to carry electronic signals that include digital images captured by the image sensor. The FPC includes an extension segment that is configured such that, upon folding the FPC onto the housing, one or more electrical contact pads disposed on the subject side of the optical train are coupled electrically with contact pads on the FPC extension segment from which MEMS actuator control signals are transmittable directly from the FPC to the MEMS lens actuator.

The housing may have defined therein a focus adjustment aperture of a predetermined shape that is configured to permit an object end of the optical train to at least partially protrude therethrough at one end of the auto-focus range; and wherein the FPC extension segment comprises a light leak baffle that partially overlaps the focus adjustment aperture to block undesired light from entering the housing, and that is disposed outside the auto-focus range of said object end of the optical train.

Another auto focus digital camera module is provided that includes a housing having an outer surface for enclosing the camera module and an interior framework, an image sensor within the housing, and an optical train coupled within the interior framework of the housing and aligned with the image sensor defining an optical path and including multiple lenses. A lens actuator, e.g., MEMS actuator, is configured to move at least one movable lens of the optical train along the optical path to focus onto an active plane of the image sensor an image of a subject that is disposed within an auto-focus range of the camera module. A printed circuit, e.g., a flexible, rigid or rigid-flexible printed circuit or a printed circuit board, is coupled to the image sensor to power the camera module and to carry electronic signals that include digital images captured by the image sensor. The printed circuit is also coupled electronically to the lens actuator to carry lens actuator control signals. An electromagnetic interference (EMI) shield coating is provided on an outside surface of the housing. A conductive trace is provided on one or more surfaces of an interior framework of the housing that permits lens actuator control signals to be carried from electrical contact pads on the printed circuit to lens actuator contact pads.

Another auto focus digital camera module is provided that includes an EMI shield housing containing a bracket that forms an interior framework inside the housing. An optical train including multiple lenses is coupled to and aligned with an image sensor within the housing to define an optical path. At least one movable lens is coupled to a lens actuator, such as a MEMS actuator, configured to move the at least one movable lens along the optical path to focus an image of a subject that is disposed within an auto-focus range of the camera module. A printed circuit is coupled to the image sensor to power the camera module and to carry electronic signals that include digital images captured by the image sensor. One or two conductive traces are formed along one or more surfaces of the bracket to electrically connect one or more, e.g., a pair of, electrical contact pads on the printed circuit to contact pads on the lens actuator permitting lens actuator control signals to be carried between the electrical contact pads on the printed circuit and the contact pads on the lens actuator.

The EMI shield housing may include an electromagnetic interference (EMI) coating on at least one surface and/or the EMI shield housing may include an electromagnetic interference (EMI) shield substrate material.

A light leak baffle may have a baffle aperture defined therein that overlaps a focus-adjustment aperture, which is defined at the subject end of the auto-focus digital camera module to permit the at least one movable lens to at least partially protrude therethrough at one end of an auto-focus range along the optical path. The light leak baffle may include EMI shield material that partially overlaps the focus adjustment aperture and is located just outside of a subject end of the auto-focus range of the digital camera module.

The light leak baffle may include a conductive or semiconductive material, e.g., carbon or carbon feather, that provides EMI shielding for optical module components. A conductive glue may couple the light leak baffle to the EMI housing. The light leak baffle may be disposed outside the housing.

Another compact optical module is provided that is configured for coupling with an image sensor component of an auto focus digital camera module. An optical train of the compact optical module includes multiple lenses including at least one movable lens and a lens actuator configured to move the at least one movable lens along an optical path to focus a subject onto an image sensor that is disposed at a focal plane of the optical train and that is coupled to a printed circuit to carry electronic signals that include digital images captured by the image sensor. An interior housing is configured as a framework to contain and align the optical train and image sensor, while an outer housing contains the interior housing and the optical train and is configured to shield the optical train and the image sensor from both electromagnetic interference (EMI) and external physical shocks. One or more shock absorbing sponges are disposed between the outer housing and the interior housing that are configured to compress to absorb external physical shocks in three spatial dimensions. One or more volumetric sponge compression gaps are defined between the external housing and the interior housing to permit relative movement without contact in a direction of the optical path of the exterior housing towards the interior housing.

The lens actuator may include a pair of lens actuator control pads for receiving lens actuator control signals from the printed circuit along a pair of conductive traces that electrically connect the printed circuit to the pair of lens actuator bond pads. The outer housing may be formed integral with the interior framework and the conductive trace may formed along the interior framework. A molded bracket may be disposed within the outer housing as the interior framework, and the conductive trace may be formed on or along one or more surfaces of the bracket.

A lens barrel may contain therein one or more of the multiple lenses including the at least one movable lens. The EMI outer housing may include an EMI coating that provides EMI shielding for optical module components. The EMI outer housing may include a conductive or semiconductive material that provides EMI shielding for optical module components.

One or more shock absorbing sponges may be disposed between the outer housing and the interior housing in such a way that they do not overlap the optical train in a direction of the optical path, and thereby compress to absorb Z-shocks without adding Z-height to the optical train.

The one or more shock absorbing sponges may also be disposed such as to not overlap the interior housing in the direction of the optical path. The one or more sponges may thereby also compress to absorb Z-shocks without adding Z-height to the interior housing.

The one or more volumetric sponge compression gaps may be configured to not overlap the interior housing in the direction of the optical path, such as to not add Z-height to the optical train.

The one or more volumetric sponge compression gaps may be defined, to at least an estimated sponge compression depth, between one or more area portions of the internal housing and the external housing that overlap in a direction of the optical path. The one or more overlapping area portions may be defined by an outer contour within a range between approximately an outermost radius of an overlapping area of the interior housing and an inner wall of a radially-adjacent shock absorbing sponge, and by an inner contour having an inner radius of an external housing annulus that defines a focus adjustment aperture, that is defined in the housing to permit extension of the optical train through the EMI housing to reach an outer boundary of an auto-focus range of a compact camera module formed by coupling and aligning an image sensor module to the compact optical module.

A second volumetric sponge compression gap may be defined, to at least an estimated sponge compression depth, to include an area between at least the inner and outer surface contours of the side walls of the EMI housing along one or more segments to permit independent movement, without contact, of the side walls of the external housing in a direction of the optical path. The second volumetric sponge compression gap may include at least a side wall section of the external housing that is configured to overlap a flexible printed circuit FPC to which a compact camera module that includes the compact optical module is configured to be coupled. The second volumetric sponge compression gap may also include one or more further side wall sections of the external housing determined to overlap one or more other obstructions to the independent movement of the external housing in the direction of the optical path and/or may completely overlaps one or more contours of the inner and outer surfaces of the side walls of the external housing.

A compact camera module may include a fixed lens coupled along the optical path just before the image sensor, e.g., that may be combined with electronic zoom image processing.

Another compact camera module is provided that includes a compact optical module coupled to a sensor module, and otherwise including any of the compact optical module, compact camera module and/or sensor module features described herein. Further embodiments include combinations of features described herein.

Auto-Focus Camera Modules

A camera module in accordance with embodiments described herein includes an image sensor, which converts an image in an optical domain to an electronic format, and an optical train that focuses the scene of interest onto the image sensor. Embodiments include cameras configured with an enhanced ability to accurately capture detail in a scene. The quality of the optical train and/or the resolution of the image sensor may be selected in accordance with a desired ability to accurately capture such detail. The image sensor may contain millions of pixels (picture elements) and the optical train of an auto-focus camera module in accordance with certain embodiments may include two, three, four, five or more lenses.

The position of at least one movable lens of the optical train is not fixed relative to the position of the image sensor, and thus, auto-focus camera modules in accordance with embodiments described herein can alter the distance from the electronic camera at which objects will be in focus on the image sensor. A system may be utilized in accordance with embodiments to determine one or more distances of one or more principal objects in a scene from the camera. The at least one movable lens is movable in accordance with the determined distance and/or until one or more principle objects are in focus on the image sensor. These objects can range from being very close (10 cm or closer) to very distant (infinity) from the camera.

Embodiments are provided herein of cameras that provide image quality that is better than conventional autofocus and fixed focus cameras. Camera modules in accordance with certain embodiments also exhibit miniature size, as well as advantageous power efficiency, and efficient, durable packaging environments that protect against unwanted physical shocks and electromagnetic interference.

Electronic cameras in accordance with certain embodiments exhibit an advantageous capability to alter the field of view significantly. For example, a photograph of a family taken in front of their house might inadvertently include a refuse container at the edge of the scene when a conventional camera is being used. A camera in accordance with certain embodiments can be adjusted to restrict the field of view of the camera to eliminate this artefact from the captured image. Conversely, a photograph of a family taken on top of a hill can be enhanced using a camera in accordance with certain embodiments by adjusting to a wider field of view that captures more of the panorama.

Cameras in accordance with certain embodiments exhibit clear improvements in overall performance by incorporating dynamic field of view feature with an auto focus mechanism. In certain embodiments, the design of the optical train of the camera includes a part that is fixed and a part that is movable along the optical axis of the camera by an actuator. In certain embodiments, some image processing is provided by code embedded within a fixed or removable storage device on the camera and/or using a remote processor, e.g., removal of image distortion.

Advantageous cameras are provided in accordance with certain embodiments that integrate all three of these in a compact camera module. Such camera module may be a stand alone camera product, or may be included in a fixed or portable electronics product, and/or in various other environments such as automobiles.

Several embodiments will now be described with reference to the figures. Electronic cameras are provided herein that advantageously incorporate integrated auto focus and optionally zoom functionality. In certain embodiments, the autofocus and zoom functions utilize a combination of an advantageous optical train and processor-based image processing, and in certain embodiments include the same or similar components in both cases.

Alternative approaches to add auto focus may involve moving one or more other lenses in the optical train as a group. An auto focus zoom camera based on this principal of operation is described in U.S. Patent application Ser. No. 61/609,293 which is incorporated by reference. This movable lens group may contain more than one movable lens, and may contain four lenses as described in the '293 application, as well as various numbers of stops and apertures depending on the particular number and geometry of the lens or lenses forming the movable lens group.

An optical train in accordance with certain embodiments that includes auto focus, and optionally also zoom, includes two general components, namely a movable lens group and a fixed lens group. FIG. 1 illustrates an auto focus zoom camera module including a first movable lens group (e.g., L1-L4) that includes one or more movable lenses that can be moved along the optical axis of the camera, and a fixed lens group (e.g., L5) that includes at least one lens that is fixed in position. The one or more moving lenses include four lenses L1-L4 in the example of FIG. 1 that are closest to the scene, while a fixed lens L5 is closest to the image sensor.

In general terms, the moving lens group performs the function of altering the focal distance of the camera, and in embodiments of camera modules that also include zoom, at least one fixed lens is configured to perform the optional electronic zoom function of matching the PSF function of the optic to the imager and compensating for the field curvature induced by the moving lens group. The fixed lens that may perform this function in specific embodiments described in the '293 application is the lens closest to the image sensor. At least one moving lens is located at an appropriate distance along the optical axis to achieve the desired focus distance, while at least one fixed lens is located such that its back focal length matches the distance between the lens and the imager.

A processor programmed by embedded code may collect information from pixels in the image sensor and make changes to the associated electronic file, in some cases automatically and in others based on user inputs, to provide zoom, as well as possibly many other image processing enhancements as set forth in the patents and pending patent applications incorporated by reference below. For example, the degree of zoom may be adjustable. The processor may also be programmed to endeavor to correct for distortion and other artefacts that are produced in a predictable manner by the optical train. The image processing features can be implemented in either hardware or software. In certain embodiments, these features are placed early in the image processing pipeline, such as RTL (resistor transistor logic) code embedded in the image sensor, while in others they are placed on an external DSP (digital signal processor) or entirely in software in a processor, such as the base band chip in a mobile phone.

An auto focus zoom camera example in accordance with the example illustrated at FIG. 1 may have a focus distance in certain embodiments that can range from 10 cm to 9 m, is typically 15 cm to 5 m and is preferably 20 cm to 3 m (excluding the hyper-focal distance), while the zoom function can range between ×0.5 to ×5, may be typically ×1 to ×4 and may be more specifically in certain embodiments between ×1 to ×3. A noteworthy characteristic of the final electronic file produced by an advantageous camera module in accordance with certain embodiments is that file size and effective resolution of the image contained within it may be largely constant in certain embodiments irrespective of the focus distance and zoom setting.

A variable optic camera in accordance with certain embodiments includes a camera wherein the optical train is divided into groups, some of which are fixed in functionality and position and others of which are variable in functionality and position. By this means, more advanced control of the optical train can be accomplished. For example, by moving two particular groups of lenses along the optical axis, the field of view of the camera can be altered. Because the resolution of a camera may be generally fixed in certain embodiments by other parameters, restricting the field of view results in effective magnification of objects in the scene. Consequently, cameras of this type are referred to as zoom cameras or auto-focus zoom cameras.

Auto-Focus Zoom Camera Modules

Several different embodiments include advantageous auto focus zoom cameras, and/or components or subsets of features of auto focus zoom cameras. In one embodiment, auto focus and zoom functionality is accomplished through a combination of: (i) one lens that is configured in combination with a zoom algorithm to provide electronic zoom and that is fixed in position relative to the image sensor, (ii) a single lens that can be moved along the optical axis of the camera or alternatively two or more moving lenses or a combination of one moving lens with two or more fixed lenses, and (iii) the zoom algorithm programmable image processing component that makes changes to the electronic form of the image. Zoom is provided in alternative embodiments with a movable lens component. In other embodiments, auto focus camera modules that do not include a zoom component are provided, wherein the example lens trains described herein for auto focus zoom camera modules may be used in auto focus camera modules (i.e., not including zoom), or the lens train may be simplified, particularly with regard to lens L5. Related embodiments and alternative features relating especially to the zoom feature of this embodiment may be described at U.S. reissue Pat. RE42,898 and at US published patent applications nos. US2009/0115885 and US2009/0225171 and are incorporated by reference. In another embodiment, zoom functionality is provided by one or more moving lenses. The single lens that can be moved in the electronic zoom embodiment may be one that is sited in the middle of the optical train and that is movable to provide auto focus functionality. More than a single lens may be movable in other embodiments, and more than one fixed lens are included in other embodiments.

Certain other optical components are included in various combinations in different embodiments, such as one or more stops, apertures and/or an infrared filter that are not always specifically mentioned with each embodiment. The infrared filter may be included between the image sensor and the last lens of the optical train, or elsewhere along the optical path. One or more apertures may be fixed at a surface of lens or independently fixed to the camera module housing or to a lens barrel housing or other fixed component of the camera module or camera device. One or more apertures may move, such as a movable aperture on or with the movable lens. In certain embodiments, an aperture for the movable lens is movable as being on or near the surface of the movable lens or otherwise fixed relative to the movable lens so that the aperture and movable are movable together using the actuator. In other embodiments the aperture for the movable lens can be fixed relative to the image sensor.

An electronic camera incorporating a fixed lens of the type described is able to provide for dynamic alteration of the field of view, in other words zoom, by imaging cropping. While cropping usually decreases image quality since information from the scene is discarded, the fidelity of the cropped image is preserved in certain embodiments because the centre of the image has been magnified by this fixed lens. This fixed lens is used in certain embodiments to produce a dynamic field of view camera that, unless corrected, would produce distortion of the image that resembles barrel distortion. The extent of the distortion is fixed and controlled by the lens design. This makes it relatively efficient to correct and remove the distortion and other predictable artefacts by configuring the image data in an image processing operation performed by an onboard processor either within the camera module itself, or outside the camera module but inside a device such as a camera phone or portable camera or tablet or laptop or other device that includes the camera module as a component of the device, or other processor coupled physically or electronically or by wireless signal to the device, and programmed by a certain algorithm designed for the specific purpose. Several embodiments of a camera with zoom based on this principal of operation are described in U.S. Pat. RE42,898, US published patent applications nos. 20120063761, 20110221936, 20110216158, 20090115885 and 20090225171, and/or U.S. patent application Ser. Nos. 61/609,293 and 13/445,857, which are incorporated by reference. The algorithm may be stored on the camera module or outside the camera module within an electronic device within which the camera module is a component, or on the cloud or otherwise as long as it is accessible by the processor that is being utilized by the camera module that is configured to apply the algorithm to image data, e.g., raw data from the image sensor or pre-processed image data, that is not yet stored, transmitted or displayed as permanent image data until the processor applies the algorithm to the data so that the image may be displayed with the appearance of zoom magnification.

The fixed lens involved in producing zoom in combination with an algorithm is, for reasons of physics advantageously disposed in certain embodiments as the lens closest to the image sensor. Alternative approaches to add auto focus may involve moving one or more other lenses in the optical train as a group. An auto focus zoom camera based on this principal of operation is described in U.S. Patent application Ser. No. 61/609,293 which is incorporated by reference. This movable lens group may contain more than one movable lens, and may contain four lenses as described in the '293 application, as well as various numbers of stops and apertures depending on the particular number and geometry of the lens or lenses forming the movable lens group. The embodiments wherein only a single lens is included in the movable lens group, such as the middle lens L3 being movable relative to two pairs of fixed lenses L1-L2 and L4,-L5 located on either side of the middle lens L3 as illustrated schematically at FIGS. 2A-2B, have an advantage of smaller mass and thus a relatively lower force is involved in moving it, and even has a surprising further advantage that a smaller displacement range actuator may be used.

Another feature of an auto focus zoom camera module in accordance with certain embodiments involves the realization of auto focus in combination with zoom from a fixed zoom lens of the type described above, by moving the middle lens in the optical train in certain embodiments, e.g., L3 in an optical train including five lenses or L4 in an optical train of seven lenses or L2 in a train of three lenses. In other embodiments, the movable lens is offset from the middle somewhere between at least one fixed lens and the rest of the optical train, e.g., L2 or L4 in the five lens embodiment or L2, L3, L5 or L6 in the seven lens embodiment. Still other embodiments involve movable lenses at one or both ends of the optical train.

Figure 2A:
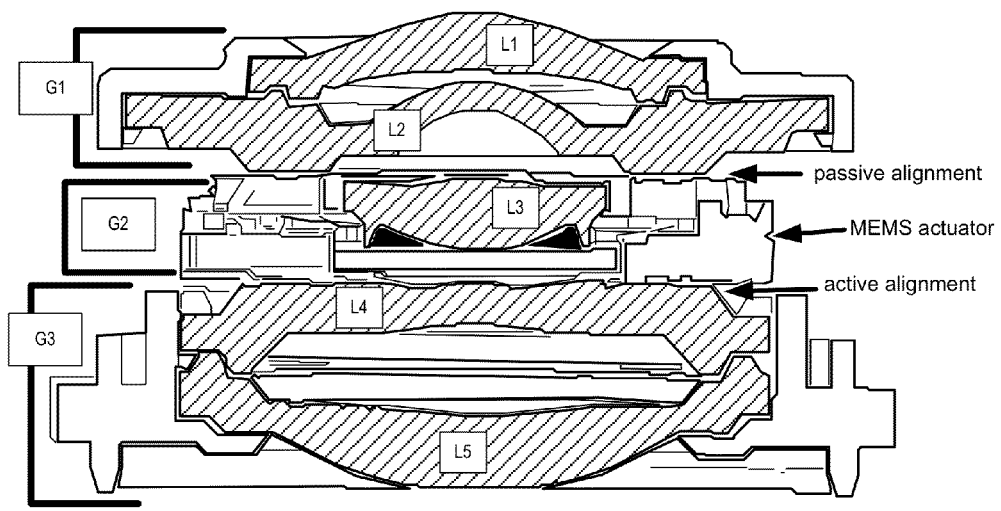
FIG. 2A schematically illustrates another example of an auto focus camera module including a different subset of one or more movable lenses and a MEMS actuator in accordance with certain embodiments.
Figure 2B:
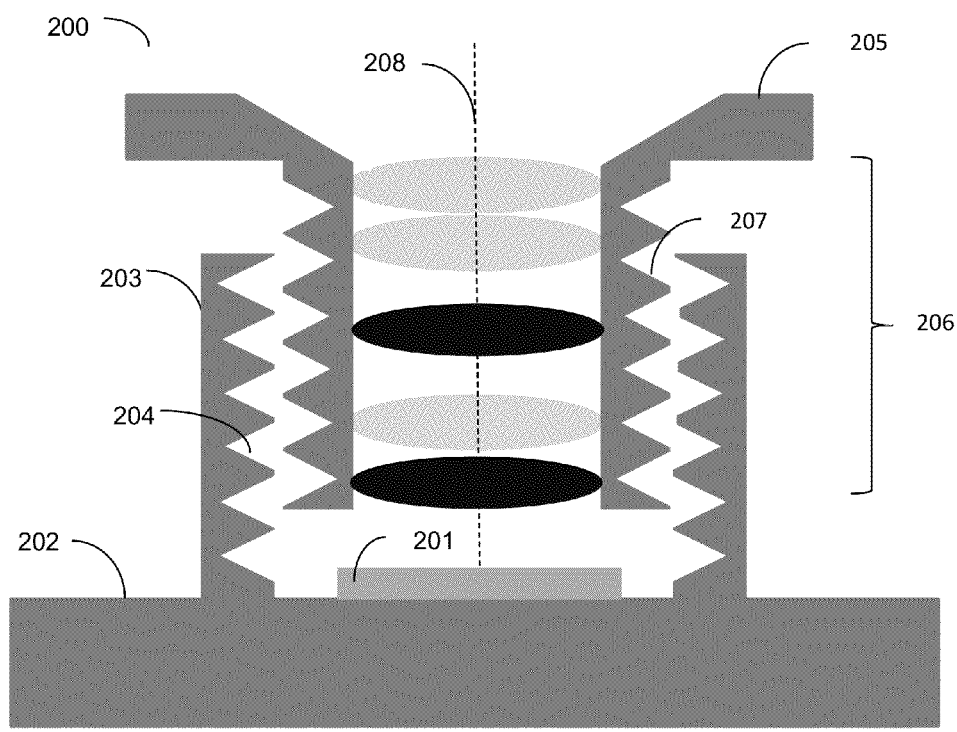
FIG. 2B illustrates a camera module that includes two main subcomponents including a sensor component and an optical train component that may be coupled and uncoupled such as to be interchangeable.

Referring now to FIGS. 2A-2B, another example of an auto focus camera module is schematically illustrated, wherein the middle lens L3 is movable between two pairs of fixed lenses L1-L2 and L4-L5. This embodiment is described at U.S. patent application Ser. No. 61/643,331, which is incorporated by reference. The embodiments wherein only a single lens is included in the movable lens group, such as the middle lens L3 being movable relative to two pairs of fixed lenses L1-L2 and L4,-L5 located on either side of the middle lens L3 have an advantage of small mass, and thus a relatively low force is involved in moving it. The single movable lens embodiments also have a surprising further advantage that a small displacement range actuator may be used. By moving the middle lens in the optical train in certain embodiments, e.g., L3 in an optical train including five lenses or L4 in an optical train of seven lenses or L2 in a train of three lenses. In other embodiments, the movable lens is offset from the middle somewhere between at least one fixed lens and the rest of the optical train, e.g., L2 or L4 in the five lens embodiment or L2, L3, L5 or L6 in the seven lens embodiment. Still other embodiments involve movable lenses at one or both ends of the optical train.

Contrary to perceived expectation, it transpires that to achieve a similar focus range to a conventional auto focus camera, the middle lens in the example of FIG. 2A is moved a relatively short distance, typically around 100 um. This makes possible the use of novel forms of actuator, such as MEMS, to move the lens and a number of consequential benefits arising from the inherent characteristics of such devices. Of the many benefits of this design, small size, low power consumption, low noise, high speed and high accuracy of movement and other improvements are provided.

FIG. 2B also schematically illustrates a cross-section through an auto focus zoom camera in accordance with certain embodiments that utilizes assembly with the lens train fabricated as a pre-aligned unitary component. The image sensor 201 resides on a substrate 202 to which is attached a sleeve 203. The sleeve has a screw thread 204 in the example illustrated at FIG. 2B. The holder 205 containing the lens train 206 has a mating screw thread 207. Rotating the holder with respect to the sleeve moves the entire lens train, in this example embodiment, along the optical axis 208 of the camera, permitting the focus to be set. Alternatives to the matching screw threads 204 and 207 include matching grooves and lands in various patterns permitting focus to be set continuously or discretely such as with a series of notches, spring-loaded pins or levers or elastic materials or other techniques to couple the lens train holder 205 with the sleeve 204 in a way that allows the distance between the image sensor 201 and one or more fixed lenses of the lens train 206 to be set.

A precision alignment in accordance with certain embodiments of the optical train permits transmission of images at high fidelity. Certain embodiments involve alignment of the various elements of the train, principally the lenses, with respect to tilt, centering and rotation with respect to one another to a certain degree of accuracy. While it is possible to achieve very exact alignment of one lens to another using active alignment techniques in certain embodiments, passive methods are used in certain embodiments, and typically wherever possible, due to the high speed of assembly and low cost of this approach. In the auto focus zoom module of certain embodiments, passive alignment tolerances are accommodated in all but one of the joints of the lens train.

Figure 3:
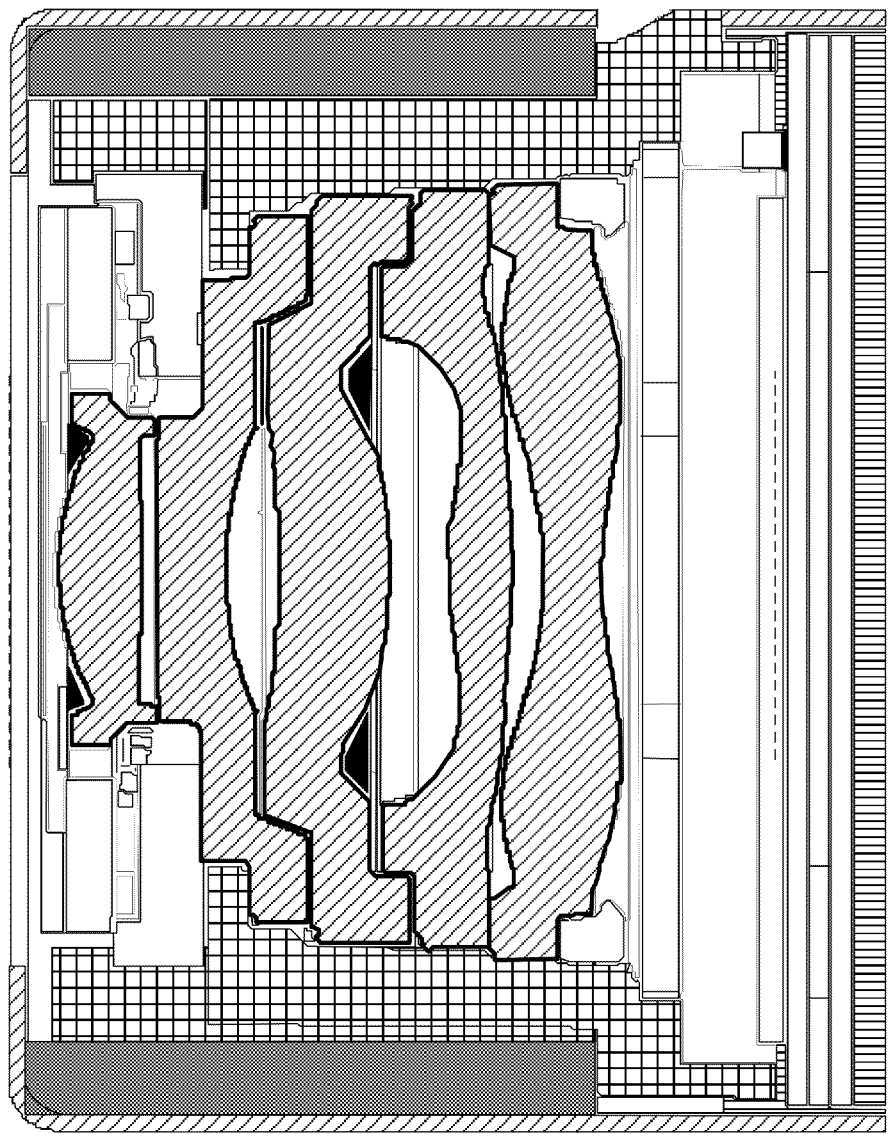
FIG. 3 schematically illustrates another example of an auto focus camera module including a different subset of one or more movable lenses and a MEMS actuator in accordance with certain embodiments.

In another embodiment, an auto focus camera may have an entire optical train that is moved in an auto focus process. In addition, advantageous cameras in accordance with embodiments described herein that include optical trains with both a movable component and a fixed component may be configured in accordance with many other examples than those illustrated at FIGS. 1 and 2A-2B. For example, the auto-focus camera module example illustrated schematically at FIG. 3 includes a MEMS actuator coupled to the furthest lens L1 from the image sensor or at the image end of the optical train. A lens barrel including L1-L4, L1-L3, L1-L2 or even just one lens L1 (or L3 as in FIGS. 2A-2B, or L2, or L4, or even L5 is some embodiments or in other embodiments only three or four lenses are included in the optical train, or in others six or seven lenses are included) may be movable using different camera module embodiments of different numbers of lenses and/or different configurations of lenses, with this MEMS actuator location. The MEMS actuator may be electrically coupled at this most imageward lens L1 of the lens barrel using one or more conductive traces that follow within a camera module bracket outside the lens barrel to the flexible printed circuit that is coupled to the camera module at the sensor end or using a flexible printed circuit extension that couples electrically to the actuator contact pads at the image end of the camera module while the sensor end is still connected to the FPC at the second location. These advantageous auto focus zoom cameras have one or more parts of the optical train fixed and one or more parts moving. In certain embodiments, cameras exhibit exactitude of centering and tilt alignment of the moving lens to the fixed lens that differs from conventional fixed or auto focus cameras.

Camera modules in accordance with several embodiments are schematically illustrated by way of example physical, electronic and optical architectures herein and within other patent applications by the same assignee or other patents. For example, other camera module embodiments and embodiments of features and components of camera modules that may be included with alternative embodiments are described at U.S. Pat. Nos. 7,224,056, 7,683,468, 7,936,062, 7,935,568, 7,927,070, 7,858,445, 7,807,508, 7,569,424, 7,449,779, 7,443,597, 7,768,574, 7,593,636, 7,566,853, 8,005,268, 8,014,662, 8,090,252, 8,004,780, 8,119,516, 7,920,163, 7,747,155, 7,368,695, 7,095,054, 6,888,168, 6,583,444, and 5,882,221, and US published patent applications nos. 2012/0063761, 2011/0317013, 2011/0255182, 2011/0274423, 2010/0053407, 2009/0212381, 2009/0023249, 2008/0296, 717, 2008/0099907, 2008/0099900, 2008/0029879, 2007/0190747, 2007/0190691, 2007/0145564, 2007/0138644, 2007/0096312, 2007/0096311, 2007/0096295, 2005/0095835, 2005/0087861, 2005/0085016, 2005/0082654, 2005/0082653, 2005/0067688, and U.S. patent application No. 61/609,293, and PCT application no. PCT/US12/24018, which are all hereby incorporated by reference.

MEMS Actuator

A MEMS actuator is coupled to L3 in the example of FIGS. 2A-2B (and to the movable lens group L1-L4 in the example of FIG. 1) to provide auto focus capability in certain embodiments. In other embodiments, a voice coil motor (VCM) or a piezo actuator may be used to provide movement capability.

Suitable MEMS actuators are described in several of the U.S. patents and U.S. patent applications incorporated by reference herein, e.g., see U.S. patent application Ser. No. 61/622,480. Another MEMS actuator having a somewhat different design is described in US-PCT application no. PCT/US12/24018. Both of these U.S. patent applications are incorporated by reference, and other examples of MEMS actuators and components thereof are cited and incorporated by reference below as providing alternative embodiments. Such actuators can be fabricated in silicon or substantially polymeric materials and have a stroke of around 100 um. They also exhibit a number of other beneficial characteristics, which are conferred on an auto focus zoom camera module of the type described. These include, very low power consumption, fast and precise actuation, low noise, negligible particulate contamination and low cost.

A MEMS actuator in accordance with certain embodiments may be thought of as generally a unidirectional device, setting aside for the moment any centering or tilt alignment movements that may be ascribed to an actuator component, even though advantageous alignment in three dimensions is provided by MEMS actuators in accordance with certain embodiments. That is, a MEMS actuator in accordance with certain embodiments has a rest position and the actuator can be driven from that rest position in one dimension, i.e., when being utilized in performing an auto-focus feature. This has a benefit for the assembly of auto focus camera modules in that it permits the entire lens train, or a substantial portion thereof, to be assembled as a pre-aligned unitary component. For subsequent assembly and calibration steps, it can then be handled similarly to or in exactly the same manner as the lens train of a fixed focus camera, namely the focus can be set by inserting a holder, containing the lens train into a sleeve fixed over the image sensor. In certain embodiments, the holder and sleeve are coupled by a screw thread.

Camera Module with Protective Cover

In certain embodiments, an optical surface can be added to the image sensor as a singulated component. This optical surface can serve as a cover, made of transparent glass or polymer, to prevent dust or other contaminant from the reaching the active surface of the sensor, while permitting visible light to get through to the sensor. The optical surface can also serve as an infrared (IR) filter, particularly for a silicon sensor. An IR absorbing material may be used for the cover or an IR coating may be applied to the glass or polymeric or other optically transparent protective cover. The optical surface can also be formed to provide optical power such as in the shape of a replicated lens L1, as in the examples of FIGS. 4A-4B, where the IR filter could also be disposed between the sensor and the lens L1 (not shown, but see U.S. Ser. No. 13/445,857, which is incorporated by reference). A process for forming the singulated component at the wafer stage before dicing is described only briefly hereinbelow, and in more detail in the '857 application.

Figure 4A:
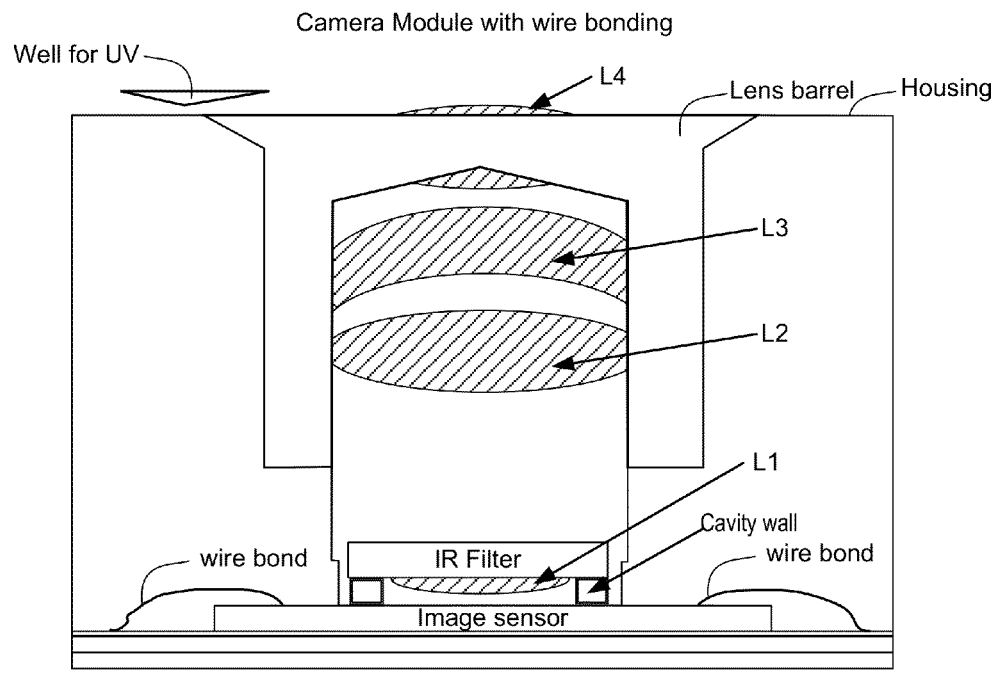
FIG. 4A schematically illustrates a cross sectional view of an example of an auto focus camera module including a wire bond image sensor configuration in accordance with certain embodiments.
Figure 4B:
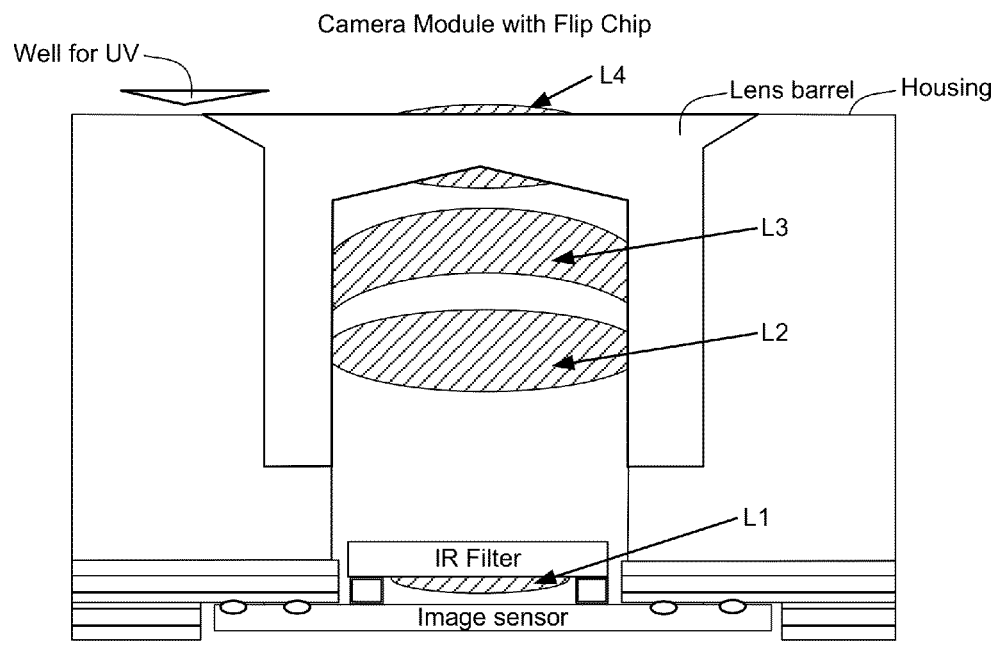
FIG. 4B schematically illustrates a cross section view of an example of an auto focus camera module including a flip-chip image sensor configuration in accordance with certain embodiments.

A singulated component is shown in FIGS. 4A-4B including an active image sensor that is protected against contamination, e.g., using wafer level hybrid optics. This approach has another advantage in that an overall physical Z height of the camera module, i.e., along optical path, normal to sensor plane, may be reduced by incorporating such hybrid optics with the camera module component.

The active image area on the image sensor is protected in accordance with certain embodiments at the wafer stage before dicing or singulation of the image sensor wafer into discrete dies. This protection of the active image area is achieved in certain embodiments by attaching a glass wafer, such as a blue glass or IR coated glass, or other material such as a polymer or other material that is transparent to visible light and absorbs or otherwise blocks IR light. Further improved functionality of this glass protection may be achieved by adding a wafer level optics element as in the examples of FIGS. 4A-4B.

FIG. 4A schematically illustrates an example camera module that includes a wire bond coupled to the camera module component. FIG. 4B schematically illustrates an example camera module that includes a flip-chip. The example camera module illustrated schematically at FIG. 4B may use thermal compression or a thermosonic process. These are described in example embodiments in more detail at U.S. patent application Ser. No. 13/445,857, which is incorporated by reference.

In auto focus and optional zoom camera modules in accordance with various embodiments, processor-based components such as distortion correction components, chromatic aberration correction components, luminance, chrominance, and/or luminance or chrominance contrast enhancement components, blur correction components, and/or extended depth of field (EDOF) and/or extended or high dynamic range (EDR or HDR) components.

Figure 5A:
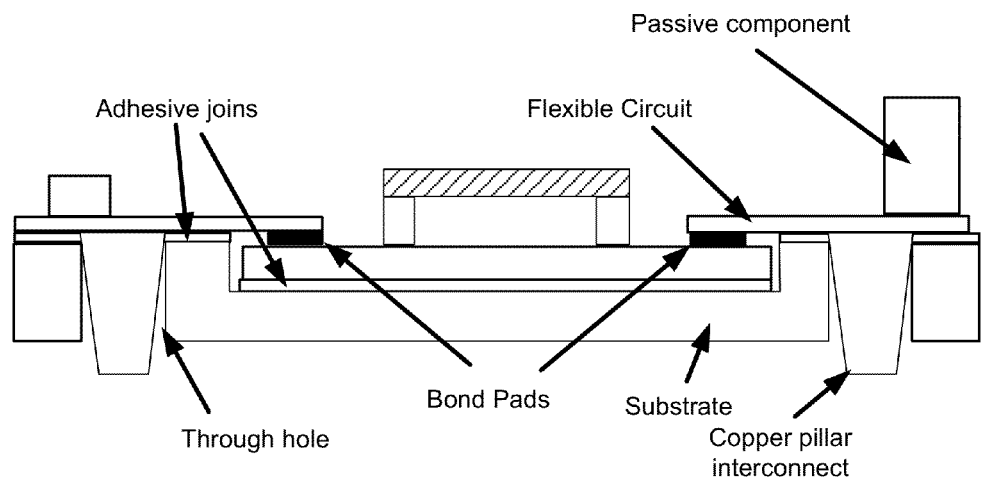
FIG. 5A schematically illustrates a section view of another camera module with copper pillar interconnects in accordance with certain embodiments.
Figure 5B:
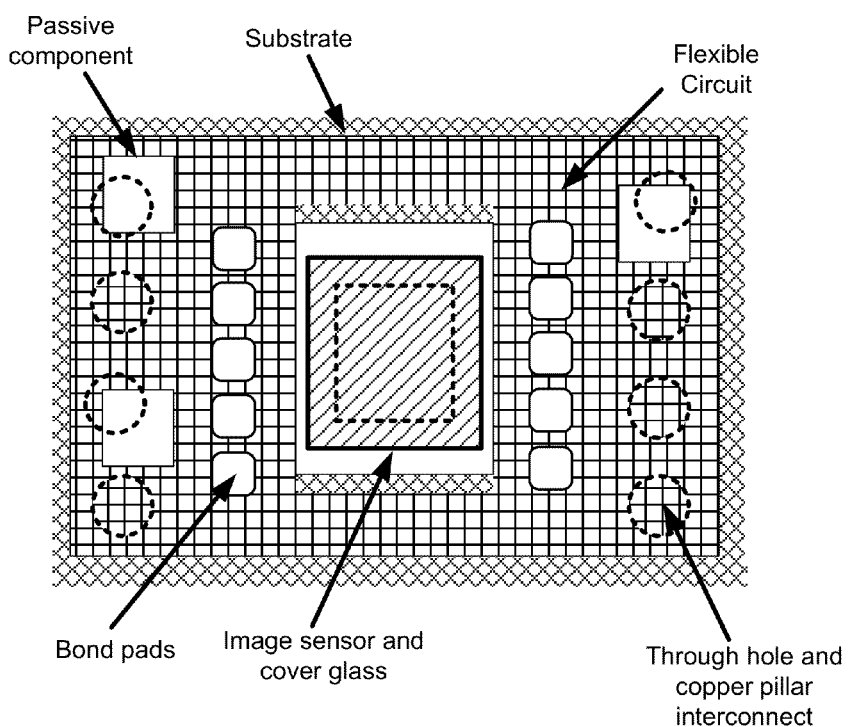
FIG. 5B schematically illustrates a plan view of the camera module of FIG. 5A.

Another example is illustrated schematically at FIG. 5A and FIG. 5B, and is also described in detail at the Ser. No. 13/445,857 U.S. application incorporated by reference above. FIGS. 5A-5B include examples of structural components of camera modules in accordance with certain embodiments that are illustrated in section and plan view, respectively. A flat substrate forms the base of the camera module of FIGS. 5A-5B. A purpose of this substrate is to provide structural support, and so suitable materials include metals (e.g., titanium), ceramics (e.g., alumina) and hard polymers like Bakelite. The substrate material may be moulded or one or more other methods may be used to fabricate an array of through-holes in it. In certain embodiments, these through holes will eventually be fully or partially filled with conductive material as part of the structure that provides the electrical interface to the camera module. Because the substrate contributes to the overall height of the camera module, it is a very thin yet sufficiently rigid. The mechanical properties of the material of the substrate, including its modulus and fracture toughness, are carefully selected in certain embodiments. The substrate may be around 200 microns thick, and can have a thickness be in a range between approximately 50 microns and 400 microns.

The image sensor and cover glass are coupled over roughly a central portion of the substrate in the example embodiment illustrated at FIGS. 5A-5B. The image sensor may be attached to the substrate using adhesive bonding or magnetically, or using one or more clips or complementary slide or twist fastening components, or using fit bonding utilizing static adhesion or thermal or compression shrink or expansion fitting, or otherwise. Over a substantial portion of the remainder of the substrate, in this example, is attached a flexible circuit. The method of attachment may be adhesive bonding or one of the just mentioned methods or otherwise. The flexible circuit may include in certain embodiments thin conductive tracks made of copper or other metal or conducting polymer on the surface of and/or embedded within a soft polymeric material like polyimide. Apertures or other features may be used to provide access to the copper tracks to make electrical connections.

As illustrated in the example of FIGS. 5A-5B, the flexible circuit has an aperture that is smaller than the image sensor in plan area. This permits the flexible circuit to be placed over the image sensor, such that the bond pads on the image sensor are covered by the flexible circuit. In this way, electrical joins may be made between the bond pads on the image sensor and suitable lands on the flexible circuit. A wide choice of methods and materials are used in accordance with several embodiments to effect such joins, with examples including conductive adhesives, thermo-compression bonds, soldered joints, and ultrasonic welds.

The image sensor is connected or connectable electrically to the flexible circuit, enabling tracking on a flexible circuit in accordance with certain embodiments to be used to route electrical connections to other sites, which may include active and/or passive components. Active and/or passive components can be attached and interconnected to the flexible circuit in various embodiments using established methods and techniques. In FIGS. 5A-5B, three (3) passive components are included in the camera module, along with ten (10) bond pads and eight (8) through-hole solder interconnects, but these numbers and locations and shapes and sizes are provided by way of illustration and many variations are possible.

External electrical connection to the camera module involves in certain embodiments electrical connection to suitable lands on the flexible circuit. By design, these lands are advantageously located over the through holes in the substrate. Although FIGS. 5A-5B depict pillars of copper for these electrical interconnects, the electrical interconnects could be fabricated from a variety of materials and structures including solder pillars, stacked stud bumps, conductive adhesives and/or deep access wire bonds. Other embodiments include mechanical structures like sprung elements and pogo pins. Where solder pillars are used, on reflow of the solder, the periphery will change shape into a hemisphere so that the external interface of the camera module resembles an interconnect for semiconductor packages similar to a ball grid array. The example structure shown in FIGS. 5A-5B includes a flat flexible printed circuit, although in other embodiments the has one or more slight bends and in others the FPC is bent into a U-shape.

FIGS. 5A-5B schematically illustrate an image sensor that is disposed in a recess in the substrate, such that image sensor bond pads are on the same level as the underside of the flexible circuit, although in other embodiments, these may be offset. Some adjustment to the detail of this alignment may take into account the thickness of the joining medium used to attach and connect the flexible circuit to the bond pads.

Camera Module Overview Example

Figure 6A:
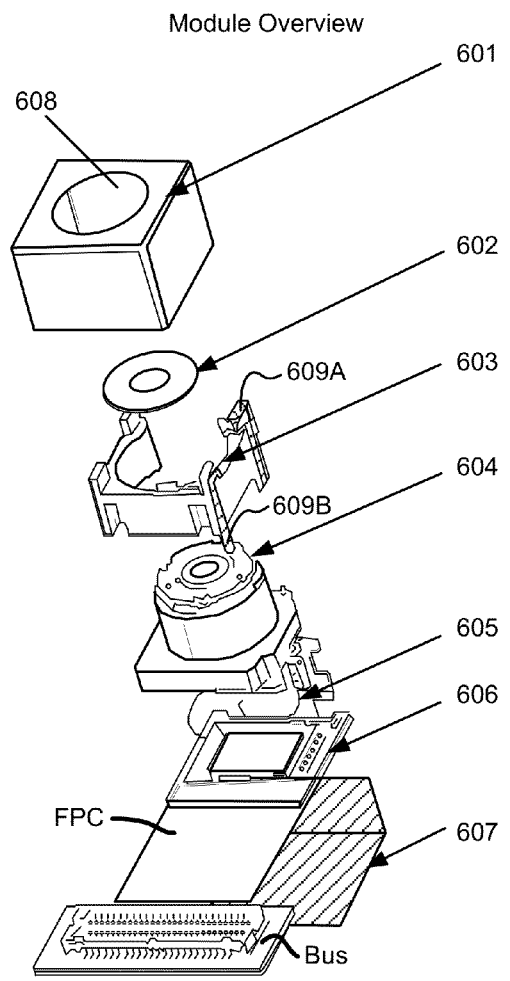
FIGS. 6A-6C schematically illustrate an exploded view, an overhead or top view and a side view, respectively, of a camera module with certain peripheral and/or internal components in accordance with certain embodiments.
Figure 6B:
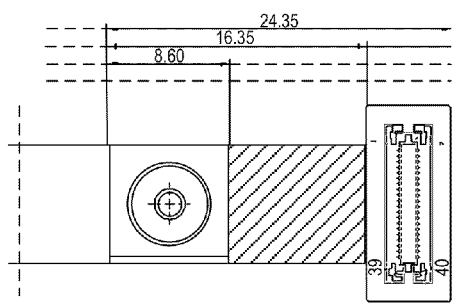
Figure 6C:
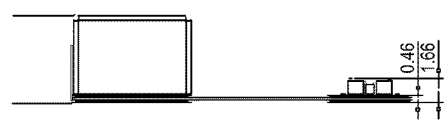

FIGS. 6A-6C illustrate in an exploded view, an overhead view and a side view, respectively, an example of a camera module including certain components that may be included along with the image sensor and optical train components in an illustrative overview example. The other components shown in FIG. 6A include an EMI shield or EMI housing 601, a light leak baffle 602, a lens barrel bracket 603, an actuator and lens barrel assembly 604, a blue glass or other IR filter component (particularly for silicon sensor embodiments) 605, a sensor component 606 (shown coupled to a flexible printed circuit FPC with a bus connector), and a bottom sponge 607.

The module size may be less than 10 mm on each side, and in certain embodiments less than 9 mm on each side, and in the X and Y directions (plane of the image sensor, normal to optical path) certain embodiments may be 8.6 mm or even 8.5 mm without EMI tape, and in the Z direction (parallel to optical path, normal to sensor plane) certain embodiments may be less than 8 mm or less than even 7 mm and in certain embodiments less than 6.5 mm or 6.4 mm, e.g., 6.315 mm with EMI tape, or less than 6.3 mm without EMI tape, e.g, 6.215 mm.

Most of the components 601-607 are described below with reference to one or more of FIGS. 7-14B, and so are summarized just briefly here with reference to FIGS. 6A-6C. The light leak baffle 602 is shown in the example of FIG. 6A as having an outer baffle diameter that approximately matches a diameter of a focus adjustment aperture 608 defined at an object end of the camera module. An inner baffle diameter is large enough to permit images to be captured by the camera with certain exposure to pass through, but small enough to block unwanted light. In another embodiment, the outer diameter of the light leak baffle 602 may be larger than the aperture 608, but the EMI housing material that overlaps the baffle 602 may be much thinner than the rest of the EMI housing 601 or the EMI housing material that overlaps the baffle may be raised in either case sufficient to permit the movement of the lens assembly, e.g., of the example of FIG. 1 or FIG. 3, to the end of its range. A light leak baffle 602 in accordance with certain embodiments has an EMI shield characteristic that supplements the EMI housing at the focus adjustment aperture 608.

The IR filter 605 is shown as a separate component in FIG. 6A that fits or is coupled or disposed on or spaced slightly from the sensor, while as mentioned above, the IR filter 605 also may be formed at wafer level together with the sensor and coupled to the sensor to form a cavity by cavity walls, while optionally also a lens nearest the image sensor, e.g., L5, is also formed at wafer level with the sensor and IR filter in the embodiments described above.

The sponge 607 is shown in the example of FIG. 6A in L shape which may be U shape and may be four sides, and a fifth side may have a space to permit the FPC to protrude just through it or under it, e.g., approximately coplanar with the top of the bottom sponge in certain embodiments including the example of FIG. 6A. Conductive traces 609A and 609B are also shown running from the bottom of the bracket where they are connectable to the FPC to the top of the bracket where they are connectable to actuator pads for energizing and controlling the actuator to move the lenses for auto-focus.

Electromagnetic Interference (EMI) Housing

Figure 7:
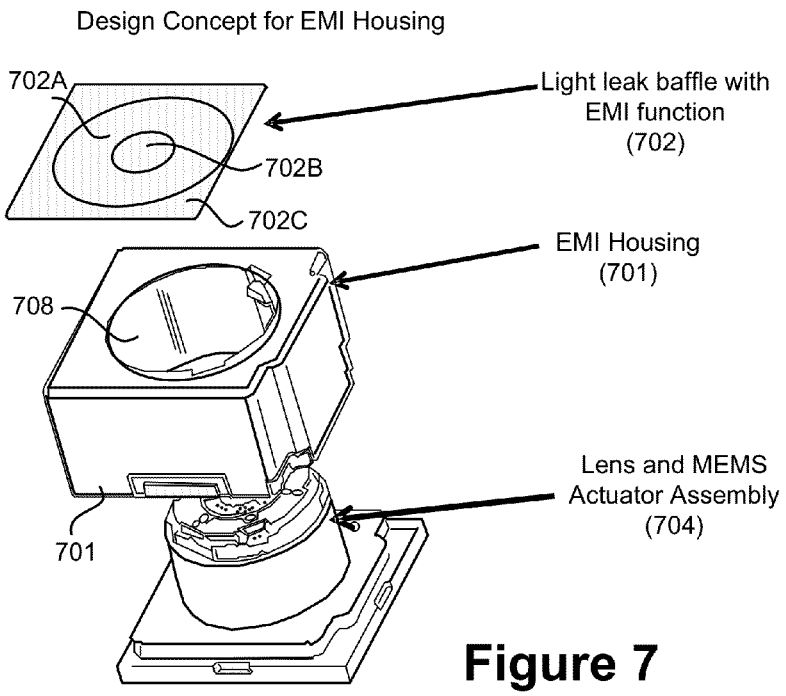
FIG. 7 schematically illustrates an exploded view of a camera module including a housing that serves as an electromagnetic interference (EMI) shield, or an EMI housing, and permits movement of an enclosed lens barrel through a focus-adjustment aperture, and a light leak baffle defining a camera aperture or that bounds or surrounds a camera module aperture or otherwise blocks undesired stray light from entering or exiting the camera module through the first aperture while transmitting desired exposures.

FIG. 7 schematically illustrates an exploded view of an example of an auto-focus camera module in accordance with certain embodiments that includes an EMI housing 701 that physically contains optical and electronic components such as Lens and MEMS actuator assembly 704, e.g., including an optical train including multiple lenses and a MEMS actuator. The EMI housing 701 serves as an electromagnetic interference (EMI) shield for components contained therein. In one embodiment, the EMI housing is made of a conducting or semiconducting material, or includes a conducting or semiconducting layer over a polymer or other insulating, durable frame. The EMI housing 701 of the example auto-focus camera module of FIG. 7 also advantageously permits movement of an enclosed lens barrel, or at least one or more lenses at the object end of the optical train, through a focus-adjustment aperture at the object end of the camera module.

Light Leak Baffle with EMI Function

The light leak baffle 702 couples to the outside of the housing 701 in this example embodiment, e.g., using an adhesive, such as conductive glue. The light leak baffle may have EMI characteristic portion 702A that overlaps aperture 708 in the Z direction parallel to the optical path of the camera module. The aperture 702B defined in the light leak baffle is surrounded by EMI portion 702A, while an outer portion 703C that overlaps material of the EMI housing 701 in the Z direction may or may not have EMI characteristic. As illustrated in the example of FIG. 6A, the outer portion is 703C is optional particularly if another way to couple the light leak baffle 602, 702 in its place along the Z axis permitting outward movement of the movable lens or lenses or lens barrel of the optical train in a focusing movement such as an auto-focus search, while being aligned in the X-Y plane to permit images of desired exposures and sharpness to be captured by the camera module, such as to couple the light leak baffle 602, 702 to the object-most end of the movable lens or lenses or lens barrel.

The light leak baffle 702 in accordance with certain embodiments is schematically illustrated in the exploded view of FIG. 7 as coupling to the top of the EMI housing, e.g., using an adhesive such as conductive glue or alternatively one or more passive alignment clips or a combination thereof. The light leak baffle may include a layer of conductive material such as carbon feather, or 2D carbon or graphene, or a thin conducting polymer, or a metal, or a combination of an insulator with a conducting layer, or alternatively the light leak baffle 702 may be made of the same material as the EMI housing except that it may be raised to permit the movement of the lens barrel or it may be separately attached by adhesive or clip. The light leak baffle 702 may define a camera aperture or may bounds or surround a camera module aperture or otherwise block undesired stray light from entering or exiting the camera module through the first aperture while transmitting desired exposures.

Figure 8:
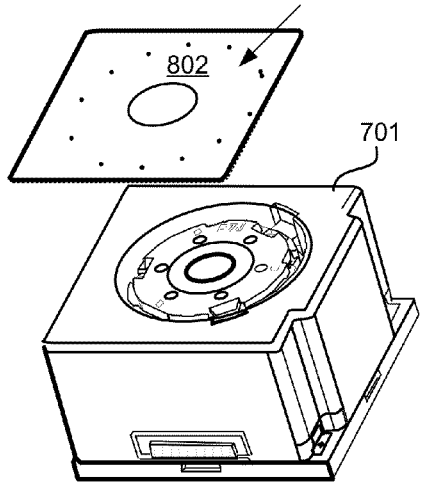
FIG. 8 illustrates the camera module with EMI housing (unexploded) and separated (for illustration) light leak baffle of FIG. 7.

FIG. 8 illustrates the camera module of FIG. 7 with EMI housing unexploded from Lens and MEMS actuator assembly, and/or illustrates the EMI housing coupled to the lens and MEMS actuator assembly. The EMI housing 701 is illustrated in FIG. 8 separated (for illustration) from a light leak baffle 802 that may comprise a carbon feather or other conductive material having EMI shield characteristic.

Figure 9:
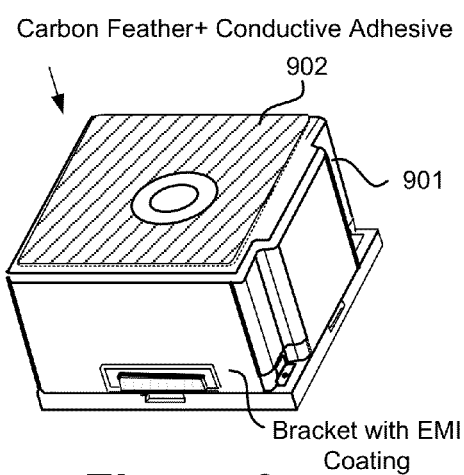
FIG. 9 schematically illustrates a camera module with EMI housing and light leak baffle in accordance with certain embodiments.

FIG. 9 illustrates the camera module of FIGS. 7-8 including EMI housing 901 with attached light leak baffle 902 on the outside of the EMI housing 901. The light leak baffle 902 of FIG. 9 defines an aperture for the camera module in certain embodiments, and in other embodiments at least reduces the amount of open area otherwise left by a larger focus adjustment aperture 608 (see FIG. 6A) of the EMI housing 901, so that less of the area surrounding the interior camera module electronics is left unprotected by EMI shielded material.

Conductive Trace Actuator Control

Figure 10A:
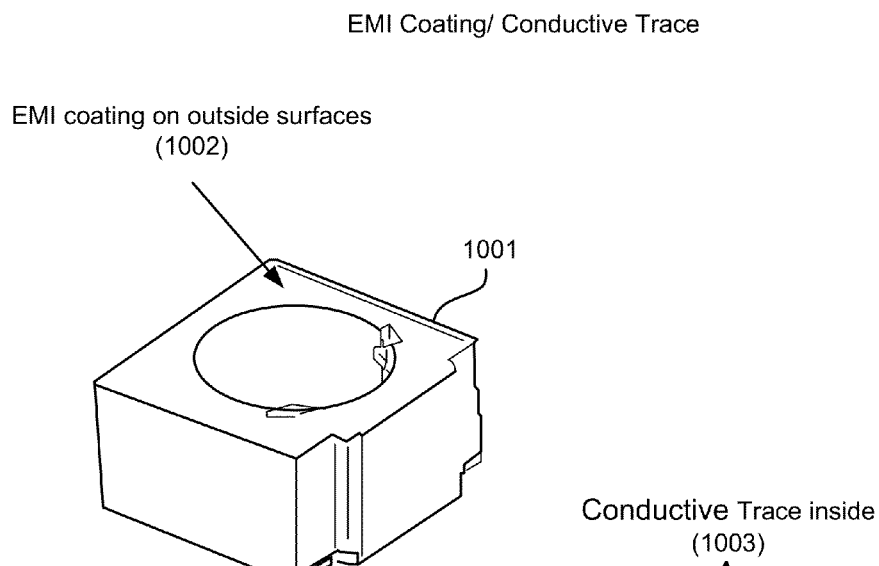
FIGS. 10A and 10B schematically illustrate top and bottom views of an EMI housing for an auto-focus camera module having an EMI coating on an outside surface and a conductive trace along an interior surface for connecting an electronic actuator component to an electronic pad or printed circuit in accordance with certain embodiments.
Figure 10B:
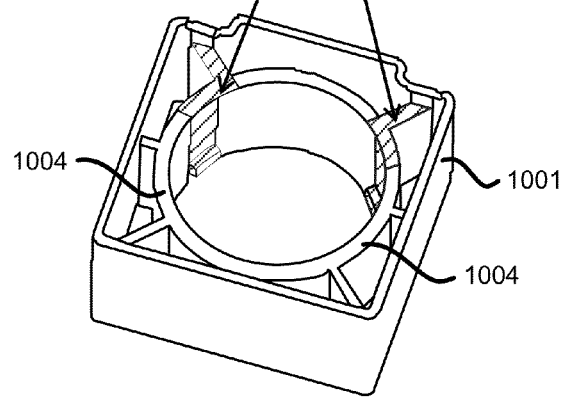

FIGS. 10A and 10B schematically illustrate top and bottom views of an EMI housing 1001 for an auto-focus camera module in accordance with certain embodiments. The EMI housing 1001 of FIGS. 10A-10B may have an insulating frame, e.g., made of a durable polymer or plastic material with an EMI coating 1002 on the outside. Alternatively, the housing 1001 may have an insulating layer over a conductive or semiconductive frame, or it may be generally conductive or semiconductive, yet the traces 1003 are electrically insulated from the conductive frame by providing the conductive traces on insulating traces, or by providing insulating tubes within a structural component of the frame 1004 or bracket 1004 inside the housing 1001.

The EMI housing 1001 in the example illustrated at FIG. 10A has an EMI coating 1002 on outside surfaces. FIG. 10B illustrates a conductive trace provided along an interior surface of the EMI housing 1001. The conductive trace 1003 is configured to connect an electronic actuator component of a camera module to an electronic pad or printed circuit in accordance with certain embodiments. The conductive trace 1003 is electrically insulated from the EMI coating material 1002 in this example because in this embodiment the material of the housing component 1001 is non-conductive. The trace 1003 may connect at the object end of an assembled camera module to a pair of actuator control pads. At the sensor end of the camera module, the conductive trace may connect to FPC contact pads. Interior structure 1004 of the housing 1001 may be built-in or formed together with the outer housing 1001 or may be a separate bracket component such as the bracket 603 illustrated in the example of FIG. 6A, e.g., a MIPTEC (microscopic integrated processing technology) bracket by Panasonic may be used, or another molded frame with a pair of fine electrical traces may be used.

Figure 11A:
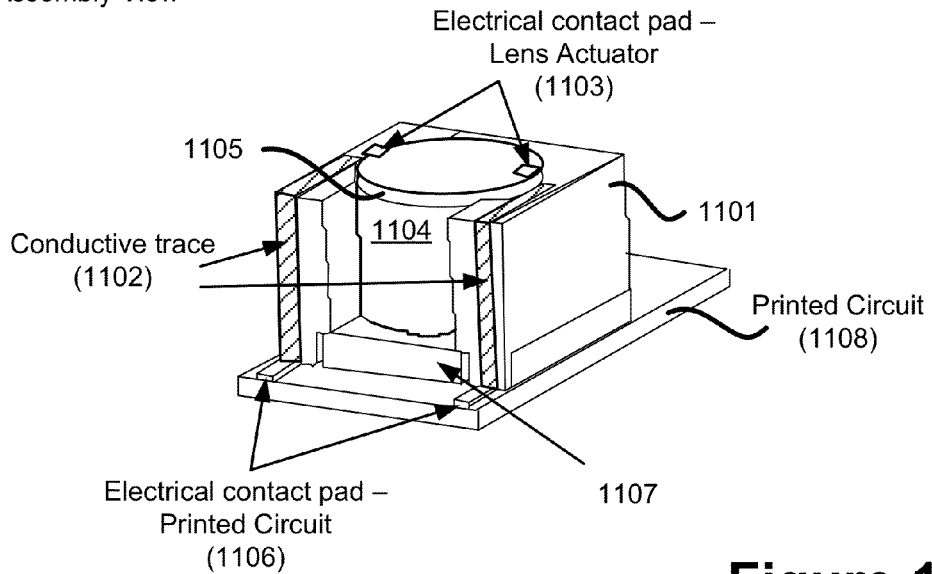
FIG. 11A-11B schematically illustrate perspective and exploded views of an auto-focus camera module including a lens barrel at least partially surrounded within a bracket that has a conductive trace thereon for connecting an electronic actuator component to an electronic pad or printed circuit in accordance with certain embodiments.
Figure 11B:
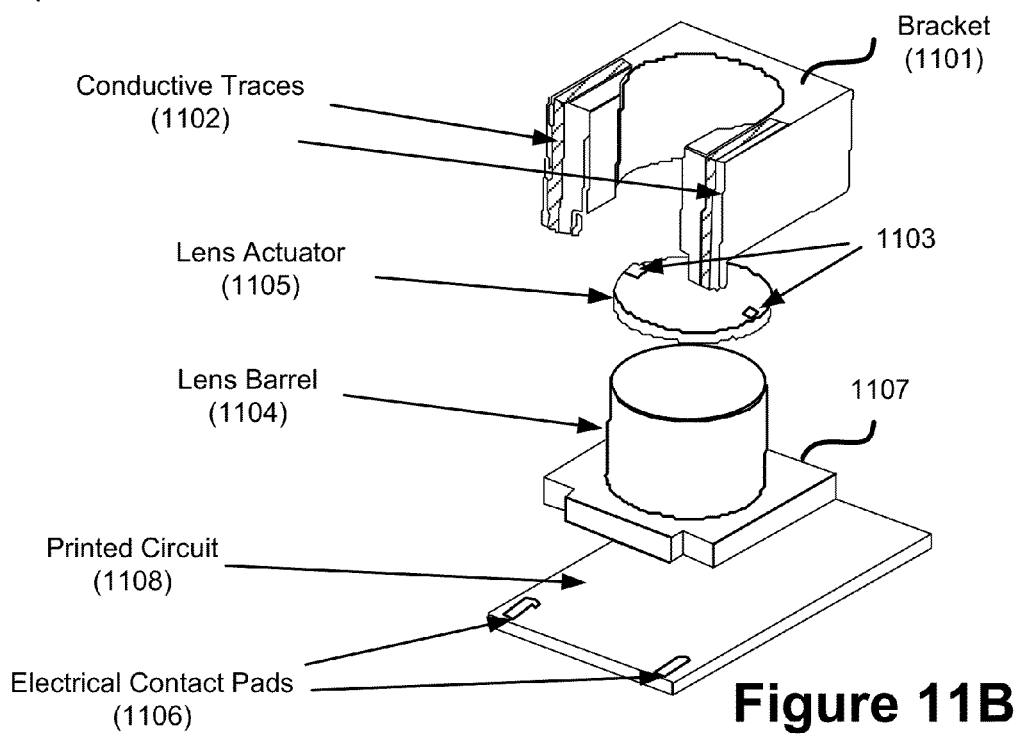

FIG. 11A-11B schematically illustrate perspective and exploded views of an auto-focus camera module in accordance with certain embodiments including a lens barrel 1104 either coupled and aligned with a sensor component 1107, or configured to be coupled with a sensor component 1107 (e.g., as in the example of FIG. 2B). The lens barrel 1104 in this embodiment is at least partially surrounded within a bracket 1101 that has a conductive trace 1102 thereon. The conductive trace 1102 in this example runs along the outside of the bracket 1101 that may be packaged with a protective EMI housing (not shown in FIGS. 11A-11B). The conductive trace 1102 may also run in other embodiments partially along the sensor component or sensor component housing or the outside of the lens barrel 1104 or through the sensor housing, or sensor (e.g., using a thermal via or thru-silicon via or conductive via or copper via as in US20110230013 or 20080157323, which are incorporated by reference). The conductive trace 1102 connects contact pads 1103 of an electronic actuator component 1105 to contact pads 1106 of a flexible printed circuit 1107 or printed circuit board 1107 in accordance with certain embodiments.

Sponge Absorbing System

Figure 12:
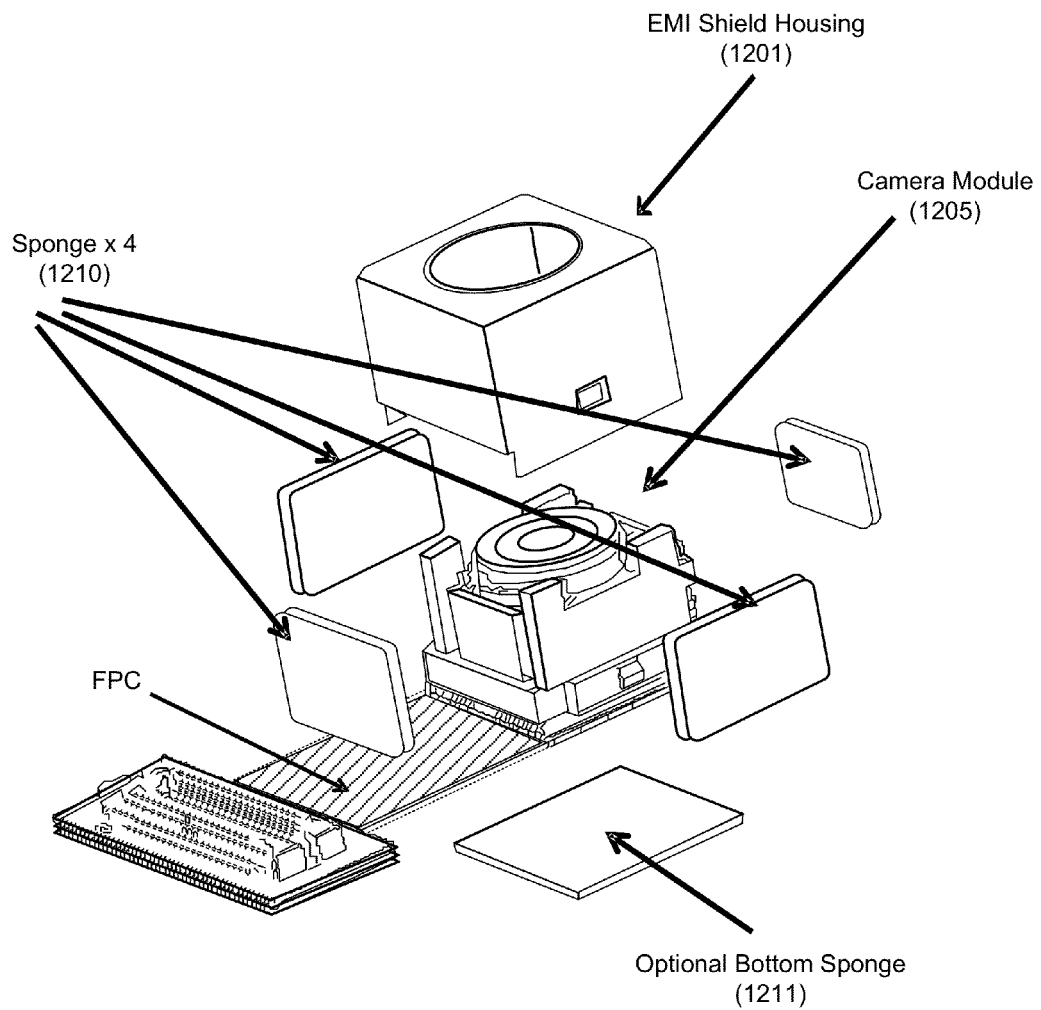
FIG. 12 schematically illustrates an exploded view of a cushioned or sponge absorbing camera module including multiple sponges disposed between the EMI housing of FIGS. 6A-11 and auto-focus optical components of a camera module in accordance with certain embodiments.

FIG. 12 schematically illustrates an exploded view of a cushioned or sponge absorbing camera module including one or more sponges 1210, e.g., four sponges 1210 are shown, disposed between the housing 1201, e.g., which may include an EMI housing such as is described above with reference to FIGS. 6A-11, and auto-focus optical components of a MEMS or other movable lens actuated auto-focus camera module 1205. The housing 1201 is configured to move independent of the interior camera module 1205 in response to an external shock that is camera absorbed by compression of one or more of the sponges 1210 and not relayed to the interior module 1205. In certain embodiments, a sponge 1210 is provided at each of four sides of the EMI housing 1201. Advantageously in certain embodiments, the sponges 1210 do not overlap the interior camera module 1205 in a direction of the optical path or Z-direction, thus not adding to the overall Z-height of the camera module 1205, and yet serving to absorb shocks in the Z-direction of the optical path.

The sponges 1210 are illustrated in the example of FIG. 12 each as a cuboid having six rectangular faces or a hexahedron with three pairs of parallel faces. One or more of the sponges 1210 may however be shaped differently, such as having more or less than six faces and/or having one or more curved and/or stepped sides. For example, one or more of the sponges 1210 may include a cutout for a passive or active component such as a gyroscope, accelerometer, or orientation sensor, or a hardware acceleration component for image analysis or image processing such as face or other object detection, tracking and/or recognition, or to accommodate an auto-focus digital camera module component having any regular or irregular size or shape, or a passive or active alignment feature or the camera module. The sponges may be shaped to conform to an irregular inner surface shape of a housing 1201 in accordance with certain embodiments, e.g., where the camera module housing 1201 is shaped to fit with other components in a cramped embedded device.

Multiple sponges may be used on each of one or more sides that may overlap or not in any direction. For example, an electrically conductive trace connecting a printed circuit, image sensor, and/or processor with MEMS actuator contact pads, or a thin battery or other electrical component may be disposed between a pair of sponge halves or partial sponges.

Another optional sponge 1211 may be included at the far side of the camera module near the image sensor but opposite the active image sensor plane from the optics of the camera module 1205. The camera module 1205 may be coupled at a sensor end to a flexible printed circuit FPC in accordance with certain embodiments, and the optional bottom sponge 1211 may cushion the camera module on either side of the FPC. The bottom sponge 1211 is advantageously thin, or excluded altogether, to maintain the thin profile of the camera module, while the shock absorbing sponginess and arrangement of the X-Y sponges 1210 and housing 1201 relative to the camera module 1205, as described in more detail below with reference to FIGS. 14A-14C, still serve to adequately protect the camera module from Z-shocks or vibrations such as drops or other unexpected external forces that may be applied along the optical axis or Z-axis of the camera module. In another alternative embodiment, a sponge may be included in various places along the optical path, e.g., between lens components and/or the light leak baffle described above may include a spongy layer along with a EMI coating or EMI layer, that includes an aperture so that image rays are not blocked on their way to the image sensor.

Use of the spongy or otherwise soft material attached on the inside of the EMI housing 1201 of the camera module absorbs vibration and shock from the outside environment in all three spatial directions. Alternatively, soft or spongy materials may be provided within one or more walls of the housing 1201 or between two components or materials of the housing 1201, e.g., between an EMI component and an insulating component of the housing 1201, or the insulating component itself may comprise the soft or spongy material that serves to prevent or dampen shocks or vibrations, while also permitting one or more conductive traces to run along the housing without shorting with any EMI shield material. Use of the spongy or otherwise soft material attached between the inside of the EMI housing and the camera module 1205 advantageously prevents failure of one or more components by forces impacting the module housing 1201 from the outside environment.

Figure 13A:
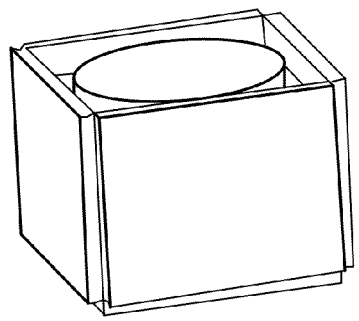
FIGS. 13A-13B schematically illustrate assembled and partially exploded views, respectively, of an x-y-z-compression sponge absorbing camera module in accordance with certain embodiments.
Figure 13B:
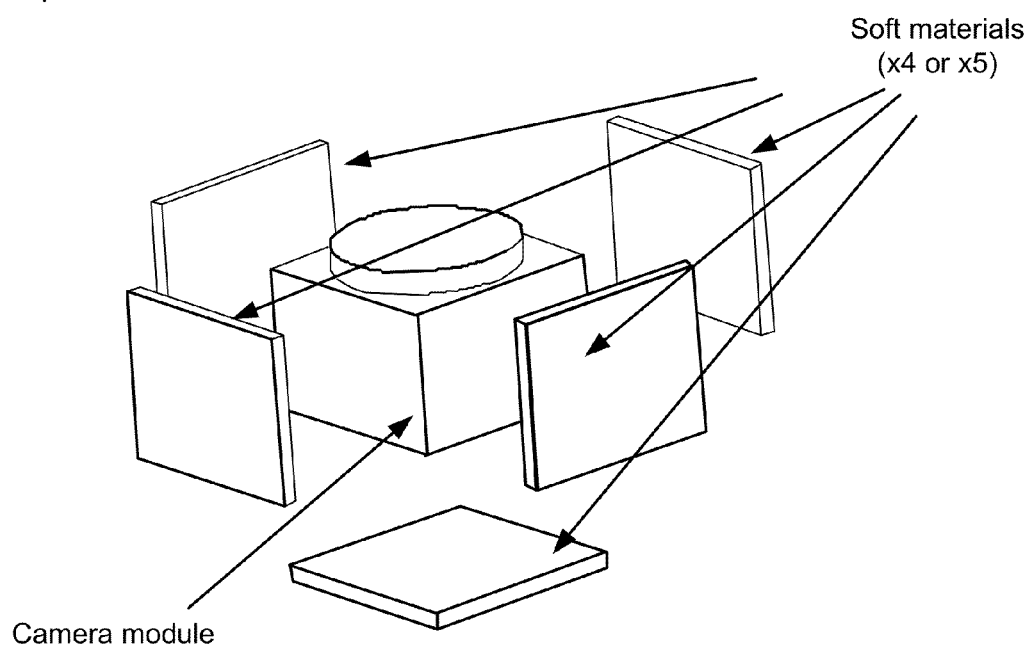

FIGS. 13A-13B schematically illustrate assembled and partially exploded views, respectively, of a cushioned or sponge absorbing camera module in accordance with certain embodiments. An outer EMI housing (not shown in FIGS. 13A-13B, but see EMI shield 1201 at FIG. 12A, with or without being coupled to a light leak baffle of for example FIG. 9) may be assembled to package the camera module as in the assembly view of FIG. 13A, such that the camera module is protected from physical shocks and vibrations as well as from electromagnetic interference and from dust, fingerprints, etc.

Figure 14A:
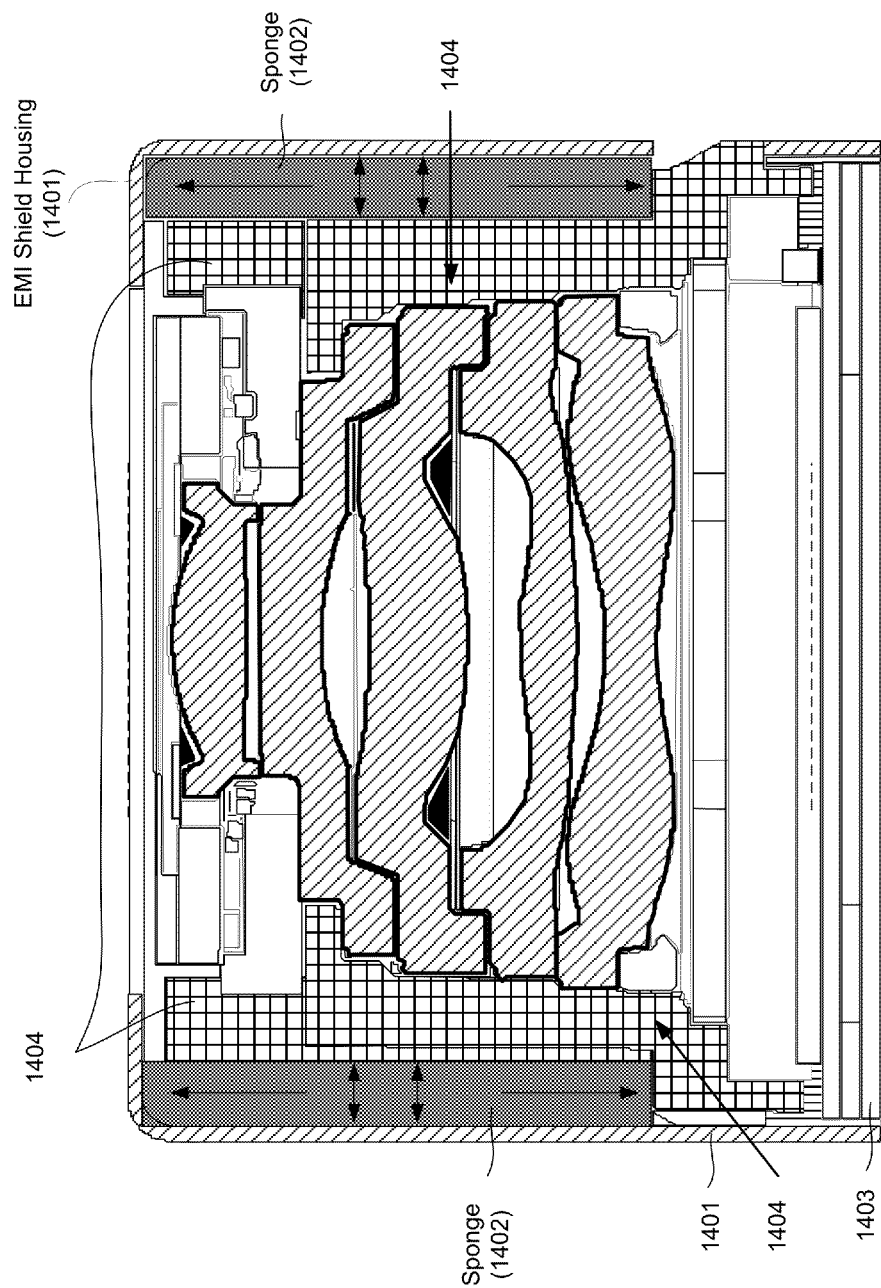
FIG. 14A schematically illustrates a cross-sectional view of the x-y-z-compression sponge absorbing camera module in accordance with certain embodiments.

FIG. 14A schematically illustrates a cross-sectional view of a x-y-z-compression sponge absorbing camera module in accordance with certain embodiments. Just inside the EMI shield 1401 are sponges 1402. There may be four sponges, one at each of four planar sides of the example camera module of FIG. 14A including the two sponges 1402 that appear on the left and right sides of the interior module 1404 in the sectional view of FIG. 14A and that overlap and have a thinner extent in the horizontal dimension X or Y. In the sectional view of FIG. 14A, the thin dimension of the sponges is normal to the optical Z-axis of the camera module, while the sponges 1402 in this example are longer in the other two spatial dimensions. One sponge 1402 is disposed on either side of the interior optics and electronics of the camera module of FIG. 14A. There may be a different number of sponges including three or two or one, or there may be one or two L-sponges that protect two sides each, or a three- or four-sided sponge may be used, such as a U sponge or a square sponge. In other embodiments, a bottom sponge 1403 may be provided with a minimal thickness. In the embodiment illustrated at FIGS. 14A, 14B and 14C, advantageously, shocks and vibrations in the Z direction are absorbed without adding to the Z-height a thick sponge. In certain embodiments, no undesirable Z height is added due to a thickness of a bottom sponge 1403. Z-shocks and Z-vibrations are absorbed due to an advantageous design of the side sponges 1402 that compress to absorb shocks in the sponge material disposed between the EMI housing 1401 and the interior components 1404 of camera module in which they reside.

Figure 14B:
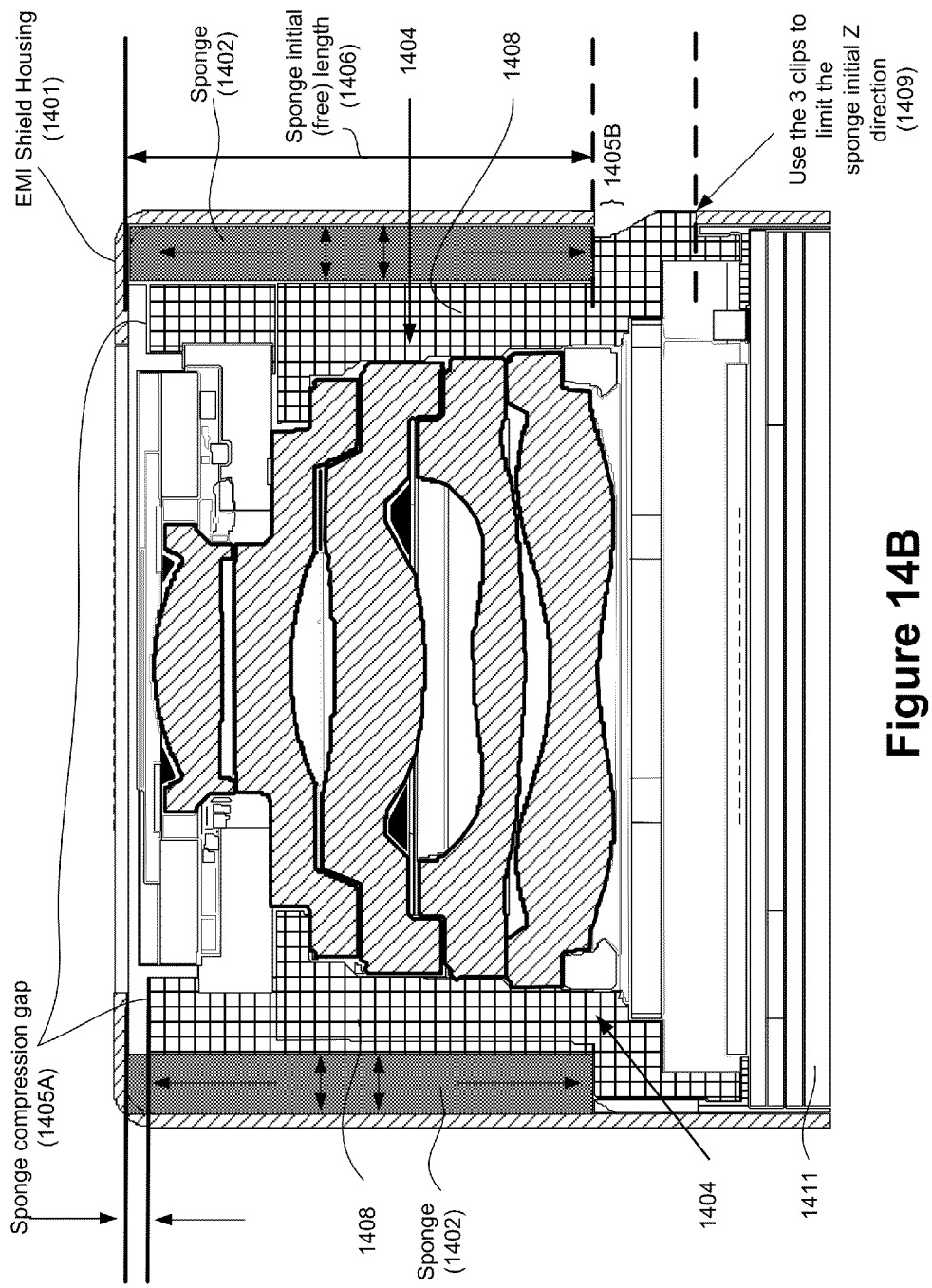
FIG. 14B schematically illustrates the sponge absorbing camera module showing advantageous empty sponge z-compression gaps before z-compression and initial sponge z-lengths designed in combination with these gaps to optimize protective elasticity in accordance with certain embodiments.

FIG. 14B schematically illustrates a sponge absorbing camera module in accordance with certain embodiment that features advantageous sponge Z-compression gaps 1405A and 1405B are provided between the EMI housing 1401, and a molded bracket 1408 portion that overlaps the EMI housing in the Z-direction. There may be one or more other such locations where the housing 1401 overlaps the bracket 1408 in the Z-direction where one or more gaps of Z-depth 1405A, B are also provided.

At the object end a light leak baffle (602, 702, 802, 902) described previously is already disposed further from the first lens surface at the object end of the optical train 1404 to accommodate motion of one or more movable auto-focus lenses. The housing 1401 may move along the Z-direction as one or both sponges 1402 compress to absorb a Z-shock, while no contact is made during this compression motion between the housing 1401 and the interior module 1404, as long as the Z-shock is not so great that it compresses the sponge 1402 in the Z-direction by more than the sponge compression gap 1405A. Initial sponge z-lengths 1406 are illustrated in FIG. 14B and are designed in combination with these gaps 1405A, 1405B to optimize protective elasticity in accordance with certain embodiments.

The amount of space provided between the last object end surface of the interior module 1404 and the light leak baffle is determined in combination with the space allocated for the movable lens group to be able to extend to the edge of the auto-focus range. So for example, the light leak baffle may be spaced apart by gap 1405A from the location of the last object end surface of the camera module at the extreme end of its focus range. This can vary with camera module design, e.g., in the design of FIG. 2A having fixed outer lens group G1, the housing itself with smaller aperture or light leak baffle may be spaced from the most object-ward surface of lens L1 by only the sponge compression gap 1405, while in other embodiments such as in the design of FIG. 1, the sponge compression gap 1405A may be added to the longest extended location of the most object-ward surface of L1. Various gaps may be provided such that the housing 1401 is independently relatively movable toward the bracket 1408 and/or toward a component of the interior module 1404 by a sponge compression length 1405 such that sponges 1402 can sufficiently compress to absorb the shock without the housing 1401 contacting any part of the bracket 1408 or interior module 1404.

In certain embodiments, the housing 1401 is shorter on a side where a flexible printed circuit couples to the camera module than on the other sides. The bottom of the housing 1401 on the FPC side is spaced apart from the FPC by at least the sponge compression gap 1405 to accommodate movement of housing 1401 toward the FPC without contact it. The other three sides of the camera module housing 1401 also have clearance to move without contacting anything. The housing 1401 may couple to one or more clips 1409 of the interior bracket 1408 by having defined therein one or more apertures or cutouts or stepped cut from the inner surface of the housing. In certain embodiments, the sponges 1402 are slightly compressed when the housing 1401 is coupled and passively aligned with the bracket 1408 and interior module 1404 when one or more clips 1409 latch or mate with one or more corresponding apertures in the housing 1401, like the example shown in FIGS. 14A-14C. In FIG. 14B, e.g., another clip 1409 could be included in an alternative embodiment, and a clip 1409 may be provided at the backside, e.g., so that the bracket 1408 has three clips 1409 that couple to three apertures in the housing 1401. Each aperture in the housing includes a gap 1405B to accommodate relative motion between the housing 1401 and the bracket 1408 especially the clip 1409.

In other embodiments, the housing 1401 may by shortened at the image end or sensor end (or at the bottom in FIG. 14B) to permit motion in the Z direction during sponge compression relative to the printed circuit or sensor substrate or other nearest component obstruction. A housing gap 1405B is shown in FIG. 14B into which the EMI shield housing 1401 can freely move when the sponges 1402 compress due to Z-shocks. Below the gap 1405B, the bracket 1408 (see, bracket 603 of FIG. 6A or bracket 1101 of FIG. 11B), e.g., may be configured with a clip 1409 or curved or inclined protrusion that contacts a lower housing segment at an outer diameter of the camera module below the gap 1405B. Alternatively, the diameter of the camera module below the housing 1401 may be reduced in diameter all the rest of the way. The gap 1407 may extend around the entire extent of the X-Y plane of the housing 1401 or a contiguous portion of the housing may have a similar gap or gaps defined below, around or through the sensor substrate or FPC, in various combinations to permit the outer housing 1401 to move with the compression of sponges 1402 without impacting the interior camera module 1404.

Figure 14C:
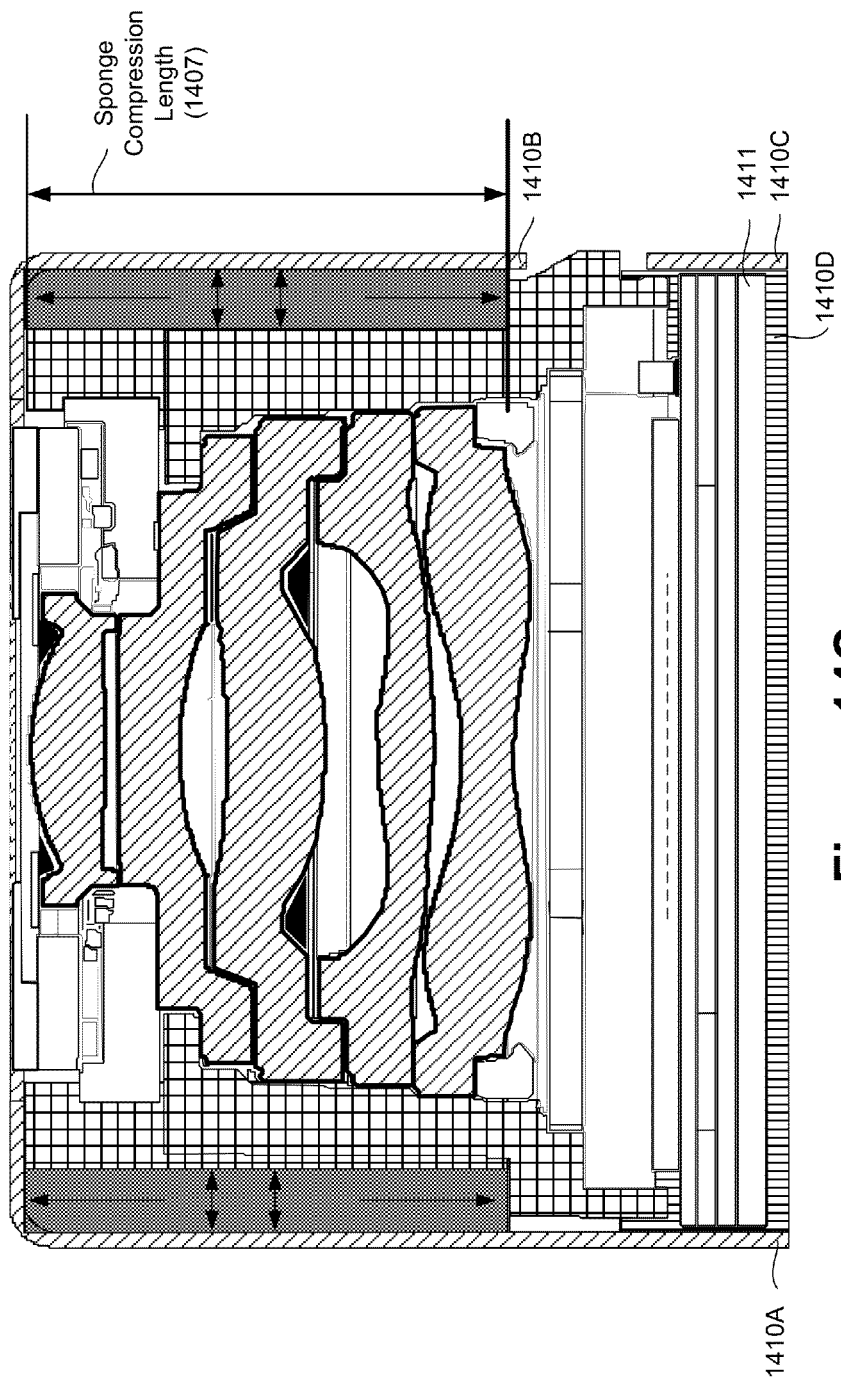
FIG. 14C schematically illustrates the camera module of FIG. 14B after z-direction compression showing filled sponge z-compression gaps and the shortened compression sponge z-lengths in accordance with an advantageously synergistic camera module architecture in accordance with certain embodiments.

FIG. 14C schematically illustrates the camera module of FIG. 14B after/during Z-direction compression showing the housing 1401 extended into gaps 1405A and 1405B when the sponge is reduced to a shortened compression sponge z-lengths 1407 from a free length 1406 in accordance with certain embodiments of an advantageously synergistic camera module architecture. By allowing the gaps 1405A, 1405B between the object end of the interior camera module 1404 or bracket 1408 and overlapping housing portion 1401, i.e., gap 1405A, and between the clips 1409 and housing 1401 at the top of a clip aperture, i.e., gap 1405B, and potentially other locations, e.g., between FPC and bottom of housing 1401, the interior module 1404 is advantageously prevented from being damaged or from having performance errors due to Z-shocks that are advantageously absorbed using the in-plane sponginess or softness of the sponges 1402, while X-shocks and Y-shocks are also absorbed using the sponginess and softness and wide area of the x-y plane dimensions of the same sponges 1402.

The camera module of FIG. 14C is shown in a condition of compression of the two sponges that are illustrated on the left and right sides of the interior module 1404. For example, an external shock having a significant component directed along the Z-direction parallel to the optical path of the camera module or vertical in FIG. 14C has been just absorbed by the sponge compression from the free length 1406 of FIG. 14B to the compressed length 1407 of FIG. 14C. The external housing 1401 moved relative to the bracket 1408 towards the bracket 1408 without contacting the bracket 1408 due to the advantageous design of the camera module that is schematically illustrated at FIGS. 14A-14C in accordance with certain embodiments.

With regard to the one passive alignment feature 1409 of the bracket 1408 that latches with an aperture illustrated on the right side in the housing 1401, the housing material that defines the top of the passive alignment aperture of FIG. 14C has moved relative to the bracket 1408 and clip 1409 into the gap 1405B resulting in no contact between the housing 1401 and bracket 1408 at clip 1409. Three sides of the housing 1401 at the bottom of the camera module on the left 1410B, on the right 1410C and in the back 1410D have each moved beneath the bottom layer 1411 of the sensor module during the compression following the Z-direction shock to the camera module, where nothing was there to contact them.

The fourth side of the camera module in this embodiment has a higher bottom position than the other three sides so that a flexible printed circuit (FPC) coupled to the image sensor can carry signals including digital image data, meta data, commands, and/or power or other camera module electronic interconnections, without being damaged on contact with the bottom edge of the fourth side of the housing when an external shock moves the fourth side of the housing 1401 relative to the image sensor and FPC that is coupled thereto during operation, and such that the FPC may be configured to approach towards or run away from the camera module to which the FPC couples at or near the image sensor component, e.g., under a relatively raised fourth side (see, e.g., FIG. 12) or through a slot in the fourth side of the housing 1401 of otherwise.

FPC Extension

In another embodiment, FPC electrical connections to MEMS actuator control signal and/or power input pads are provided at or near the object end of the camera module, or at least significantly far from the original FPC connection to the sensor component to involve a trace connection to the actuator contact pads at least a non-trivial one. The FPC in the embodiment of FIGS. 15A-15C is bent around the camera module from the original physical and electronic FPC connection at the sensor component and makes a second electronic connection to electronic actuator pads opposite the sensor end of the camera module. The FPC may have a specially shaped end or FPC extension that both physically and electronically connects with the actuator pads such that the alignment is precise enough so as not to block the optical path of light otherwise on its way to forming sufficiently-exposed images on the image sensor.

FIGS. 15A-15C schematically illustrate a camera module, with before-FPC bending perspective, during-FPC bending overhead, and after-FPC bending rotated perspective views, respectively, in accordance with certain embodiments. The camera module 1501 is physically and electronically coupled at the sensor component to a bendable, flexible printed circuit (FPC) 1502 at a sensor connection segment 1502A in FIG. 15A. Certain electronics 1503 may be coupled to a side segment 1503A where those electronics fit into an empty space due to, for example, use of a U-shaped bracket or internal EMI housing framework that leaves a space at one side that is filled with the electronics 1503 and enclosed by the side segment 1503A of the FPC 1502. An accelerometer and/or an orientation sensor may be included at a portion of the empty space there too (see, e.g., U.S. Ser. Nos. 61/622,480 and 61/675,812, which are assigned to the same assignee and incorporated by reference). The FPC 1502 in the embodiment of FIG. 15A also includes an FPC extension 1504, which may be an end segment or just a FPC segment 1504 displaced from the sensor connection segment 1502 a precise amount after the sensor connection segment and side segment 1503. The FPC extension segment 1504 includes two or more conductive side pads 1504A for electrically contacting actuator pads at the image end of the lens barrel of the camera module. The FPC extension 1504 or end segment may define a partial, semicircular or full cut-out 1505 to overlay the aperture of the camera module so that desired imaging rays are not blocked from entering the camera module, and so that undesired rays are blocked further out from the central part of optical path. The FPC 1502 may connect to the sensor end of the camera module at a FPC end segment in an alternative embodiment, and bend around to connect to the actuator pads and continue to its connections external to the camera module from the actuator connection segment 1504 (instead of as shown from the sensor segment 1502A). The FPC extension 1504 may have EMI shielding properties like any of the example light leak baffles 602, 702, 802, 902 or FIGS. 6A-9 referred to above.

FIGS. 16A-16B schematically illustrate a camera module in accordance certain embodiments, before and after FPC bending, similar to the embodiments just described with reference to FIGS. 15A-15B, respectively. The FPC 1601 is configured to physically and electrically connect to a sensor end of the camera module 1602, and to electrically connect to actuator contacts 1603 with sufficient physical coupling stability using interleaving and/or clasping hook attachments or other passive complementary features on the actuator end such as FPC conductive pad cutouts 1604 and raised actuator control contact pads 1603 and/or dedicated physical coupling protrusions and/or cutouts. The same FPC segment 1605 that includes the actuator pad conductive contacts 1604 may have an aperture 1606 configured to serve as or couple to a light leak baffle, e.g., as alternative to the light leak baffles 602, 702, 802, 902 of the embodiments described with reference to FIGS. 6A-9, and more similar to the embodiment of FIGS. 15A-15B. In the embodiments of FIGS. 15A-16B, as well as those of FIGS. 6A-9, room is provided in the Z direction for movement of a lens group that provides advantageous auto-focus range, while light that would otherwise leak in the gap between the outer optic and auto-focus aperture (e.g., aperture 708 of FIG. 7) when the outer optic is not extended through the auto-focus aperture. As with the earlier embodiments, the FPC segment 1605 may have an EMI shield property that makes it multi-advantageous and multi-functional.

While an exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention.

In addition, in methods that may be performed according to preferred embodiments herein and that may have been described above, the operations have been described in selected typographical sequences. However, the sequences have been selected and so ordered for typographical convenience and are not intended to imply any particular order for performing the operations, except for those where a particular order may be expressly set forth or where those of ordinary skill in the art may deem a particular order to be necessary.

In addition, all references cited above and below herein are incorporated by reference, as well as the background, abstract and brief description of the drawings, and U.S. application Ser. Nos. 12/213,472, 12/225,591, 12/289,339, 12/774,486, 13/026,936, 13/026,937, 13/036,938, 13/027,175, 13/027,203, 13/027,219, 13/051,233, 13/163,648, 13/264,251, and PCT application WO2007/110097, and U.S. Pat. Nos. 6,873,358, and RE42,898 are each incorporated by reference into the detailed description of the embodiments as disclosing alternative embodiments.

The following are also incorporated by reference as disclosing alternative embodiments:

U.S. Pat. Nos. 8,055,029, 7,855,737, 7,995,804, 7,970,182, 7,916,897, 8,081,254, 7,620,218, 7,995,855, 7,551,800, 7,515,740, 7,460,695, 7,965,875, 7,403,643, 7,916,971, 7,773,118, 8,055,067, 7,844,076, 7,315,631, 7,792,335, 7,680,342, 7,692,696, 7,599,577, 7,606,417, 7,747,596, 7,506,057, 7,685,341, 7,694,048, 7,715,597, 7,565,030, 7,636,486, 7,639,888, 7,536,036, 7,738,015, 7,590,305, 7,352,394, 7,564,994, 7,315,658, 7,630,006, 7,440,593, 7,317,815, and 7,289,278, and U.S. patent application Ser. Nos. 13/306,568, 13/282,458, 13/234,149, 13/234,146, 13/234,139, 13/220,612, 13/084,340, 13/078,971, 13/077,936, 13/077,891, 13/035,907, 13/028,203, 13/020,805, 12/959,320, 12/944,701 and 12/944,662;

United States published patent applications serial nos. US20120019614, US20120019613, US20120008002, US20110216156, US20110205381, US20120007942, US20110141227, US20110002506, US20110102553, US20100329582, US20110007174, US20100321537, US20110141226, US20100141787, US20110081052, US20100066822, US20100026831, US20090303343, US20090238419, US20100272363, US20090189998, US20090189997, US20090190803, US20090179999, US20090167893, US20090179998, US20080309769, US20080266419, US20080220750, US20080219517, US20090196466, US20090123063, US20080112599, US20090080713, US20090080797, US20090080796, US20080219581, US20090115915, US20080309770, US20070296833 and US20070269108

What is claimed is:

1. A compact camera module, comprising
an image sensor configured to couple to a flexible printed circuit to power the camera module and transmit images captured at the image sensor;
an optical train aligned with the image sensor that includes multiple lenses including at least one movable lens coupled to an actuator to form an optical system that is configured to automatically adjust a position of the at least one movable lens along the optical path to focus an object disposed within an auto-focus range of the camera module onto the image sensor;
an EMI housing configured to contain the optical train and to shield camera module components from electromagnetic interference (EMI), the EMI housing having defined therein a focus-adjustment aperture that is large enough to permit an object end of the optical train to at least partially protrude therethrough at one end of the auto-focus range; and
a light leak baffle that has a baffle aperture defined therein that partially overlaps the focus-adjustment aperture along said optical path, the light leak baffle comprising EMI shield material that partially overlaps the focus adjustment aperture in the direction of the optical path but outside said one end of the auto-focus range.

2. The compact camera module of claim 1, further comprising a lens barrel containing therein one or more of the multiple lenses including the at least one movable lens.

3. The compact camera module of claim 1, wherein the EMI housing comprises an EMI coating.

4. The compact camera module of claim 1, wherein the light leak baffle comprises a conductive material that provides EMI shielding for camera module components.

5. The compact camera module of claim 4, wherein the conductive material of the light leak baffle comprises carbon.

6. The compact camera module of claim 1, further comprising a conductive glue for coupling the light leak baffle to the housing.

7. The compact camera module of claim 1, wherein the light leak baffle is disposed outside the housing.

8. The compact camera module of claim 1, further comprising a pair of conductive traces inside the EMI housing electrically connecting a pair of contact pads of said actuator with a pair of contact pads on said flexible printed circuit.

9. The compact camera module of claim 8, wherein a FPC segment adjacent the segment to which the sensor is coupled is folded to enclose a side wall of the compact camera module.

10. The compact camera module of claim 1, further comprising a flexible printed circuit (FPC) extension coupled to the light leak baffle and having a pair of contact pads that electrically connect to a pair of contact pads of said actuator when the FPC is folded around said compact camera module.

11. The compact camera module of claim 10, wherein a middle FPC segment between the segment to which the sensor is coupled and the FPC extension segment encloses a side wall of the compact camera module when the FPC is folded around said compact camera module.

12. The compact camera module of claim 1, further comprising one or more shock absorbing sponges including shock absorbing sponge material disposed between the EMI housing and an interior housing that contains the optical train on at least two sides of the interior housing; and wherein one or more sponge compression gaps are defined between the EMI housing and the interior housing in a Z-direction approximately parallel to the optical path to permit relative movement of the EMI housing towards the interior housing without contact during compression of the one or more shock absorbing sponges due to a Z-component of an external shock to the compact camera module.

13. A compact camera module, comprising
a compact optical module coupled to a sensor module,
wherein the compact optical module comprises
an optical train including multiple lenses and including at least one movable lens coupled to an actuator to form an optical system that is configured to automatically adjust a position of the at least one movable lens along the optical path to focus an object disposed within an auto-focus range of the camera module onto an image sensor that is aligned with the optical train;
an EMI housing configured to contain the optical train and to shield camera module components from electromagnetic interference (EMI), the EMI housing having defined therein a focus-adjustment aperture that is large enough to permit an object end of the optical train to at least partially protrude therethrough at one end of an auto-focus range; and
a light leak baffle including a baffle aperture defined therein that overlaps the focus-adjustment aperture along said optical path, the light leak baffle comprising EMI shield material that partially overlaps the focus adjustment aperture outside said one end of the auto-focus range; and
wherein the sensor module comprises an image sensor that is aligned with the compact optical module and is coupled to or is configured to couple to a flexible printed circuit to power the camera module and transmit images captured at the image sensor.

14. The compact camera module of claim 13, wherein the sensor module comprises a fixed lens coupled along the optical path just before the image sensor.

15. The compact camera module of claim 13, further comprising a lens barrel containing the optical train including the at least one movable lens.

16. The compact camera module of claim 13, wherein the EMI housing comprises an EMI coating.

17. The compact camera module of claim 13, wherein the light leak baffle comprises a conductive material that provides EMI shielding for camera module components.

18. The compact camera module of claim 17, wherein the conductive material of the light leak baffle comprises carbon.

19. The compact camera module of claim 13, further comprising a conductive glue for coupling the light leak baffle to the housing.

20. The compact camera module of claim 13, wherein the light leak baffle is disposed outside the housing.

21. The compact camera module of claim 13, further comprising a pair of conductive traces inside the EMI housing electrically connecting a pair of contact pads of said actuator with a pair of contact pads on said flexible printed circuit.

22. The compact camera module of claim 21, wherein a FPC segment adjacent the segment to which the sensor is coupled is folded to enclose a side wall of the compact camera module.

23. The compact camera module of claim 13, further comprising a flexible printed circuit (FPC) extension coupled to the light leak baffle and having a pair of contact pads that electrically connect to a pair of contact pads of said actuator when the FPC is folded around said compact camera module.

24. The compact camera module of claim 23, further comprising a middle FPC segment, disposed between the segment to which the sensor is coupled and the FPC extension segment, that encloses a side wall of the compact camera module when the FPC is folded around said compact camera module.

25. The compact camera module of claim 13, further comprising one or more shock absorbing sponges, disposed between the EMI housing and an interior framework containing the optical train, that include shock absorbing sponge material on at least two interior sides of the EMI housing; and wherein one or more sponge compression gaps are defined between the EMI housing and the interior framework in a Z-direction approximately parallel to the optical path of the camera module, said one or more gaps being configured to permit relative movement of the EMI housing towards the interior framework during compression of the one or more shock absorbing sponges which thereby absorb a Z-direction component of an external shock to the camera module without overlapping the optical train nor the interior framework.

26. A compact optical module configured for coupling with an image sensor component of an auto focus digital camera module, the compact optical module comprising:
    an optical train of multiple lenses disposed within a lens barrel and including at least one movable lens coupled to an actuator to form an optical system that is configured to automatically adjust a position of the at least one movable lens along the optical path to focus an object disposed within an auto-focus range of the camera module onto an image sensor component to which the compact optical module is coupled;
    an EMI housing configured to contain the optical train and to shield camera module components from electromagnetic interference (EMI) and defining a focus-adjustment aperture that is large enough to permit an object end of the lens barrel to at least partially protrude therethrough at one end of an auto-focus range; and
    a light leak baffle that has a baffle aperture defined therein that overlaps the focus-adjustment aperture along the optical path and that includes EMI shield material that partially overlaps the focus adjustment aperture outside of said one end of the auto-focus range of the lens barrel.

27. The compact optical module of claim 26, wherein the compact optical module comprises one or more passive alignment features configured to couple with one or more complementary features of an image sensor module to couple and align the compact optical module and the image sensor module.

28. The compact optical module of claim 26, wherein the EMI housing comprises an EMI coating.

29. The compact optical module of claim 26, wherein the light leak baffle comprises a conductive material that provides EMI shielding for optical module components.

30. The compact optical module of claim 29, wherein the conductive material of the light leak baffle comprises carbon.

31. The compact optical module of claim 26, further comprising a conductive glue for coupling the light leak baffle to the EMI housing.

32. The compact optical module of claim 26, wherein the light leak baffle is disposed outside the housing.

33. The compact optical module of claim 26, further comprising a pair of conductive traces inside the EMI housing configured for electrically connecting a pair of contact pads of said actuator with a pair of contact pads on a flexible printed circuit (FPC) when a sensor component that is coupled to the compact optical module, to form a compact camera module, is itself coupled to the FPC.

34. The compact optical module of claim 33, wherein an open side wall is defined in the compact optical module that is configured to be enclosed by a folded FPC segment adjacent the segment to which the sensor is coupled.

35. The compact optical module of claim 26, wherein the actuator comprises a pair of contact pads configured to electrically connect to a pair of contact pads on a flexible printed circuit (FPC) extension segment that is coupled to the light leak baffle when the FPC is folded around a compact camera module formed by coupling a sensor module to the compact optical module and when the sensor module is coupled to the FPC at a different segment spaced apart from the FPC extension segment.

36. The compact optical module of claim 35, wherein an open side wall is defined in the compact optical module that is configured to be enclosed by a folded middle FPC segment, disposed between the segment to which the sensor is coupled and the FPC extension segment, when the FPC is folded around said compact camera module formed by coupling said sensor module with said compact optical module.

37. The compact optical module of claim 26, further comprising one or more shock absorbing sponges disposed between the EMI housing and a molded framework containing the lens barrel, including shock absorbing sponge material on at least two sides of the lens barrel; and wherein one or more sponge compression gaps are defined between the EMI housing and the molded framework permitting relative movement of the EMI housing in the Z-direction during sponge compression due to an external shock without sponge material overlapping the optical train nor molded framework.

38. The compact camera module of claim 1, wherein:
    the EMI housing has a first end closest to the image sensor and a second end opposite the first end;
    the second end defines the focus-adjustment aperture; and
    the light leak baffle is disposed outside the EMI housing and over the second end.

* * * * *